(12) United States Patent
Takasugi et al.

(10) Patent No.: US 10,547,316 B2
(45) Date of Patent: Jan. 28, 2020

(54) GATE SHIFT REGISTER AND ORGANIC LIGHT EMITTING DIODE DISPLAY INCLUDING THE SAME

(71) Applicant: LG Display Co., Ltd., Seoul (KR)

(72) Inventors: Shinji Takasugi, Paju-si (KR); Wooseok Choi, Daegu (KR); Minkyu Chang, Daegu (KR); Jaeyi Choi, Daegu (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/967,035

(22) Filed: Apr. 30, 2018

(65) Prior Publication Data

US 2018/0337682 A1    Nov. 22, 2018

(30) Foreign Application Priority Data

May 22, 2017 (KR) .......................... 10-2017-0063176

(51) Int. Cl.
| | | |
|---|---|---|
| *G11C 19/00* | (2006.01) | |
| *H03K 21/18* | (2006.01) | |
| *G09G 3/3241* | (2016.01) | |
| *G09G 3/36* | (2006.01) | |
| *G11C 19/28* | (2006.01) | |

(52) U.S. Cl.
CPC ........... *H03K 21/18* (2013.01); *G09G 3/3241* (2013.01); *G09G 3/3677* (2013.01); *G09G 2310/0286* (2013.01); *G11C 19/28* (2013.01)

(58) Field of Classification Search
None
See application file for complete search history.

(56) References Cited

U.S. PATENT DOCUMENTS

| | | | |
|---|---|---|---|
| 2012/0082287 A1* | 4/2012 | Moriwaki | G11C 19/28 377/64 |
| 2015/0187268 A1* | 7/2015 | Tani | G09G 3/3233 345/77 |
| 2018/0096644 A1* | 4/2018 | Jang | G09G 3/20 |
| 2018/0144702 A1* | 5/2018 | Furuta | G09G 3/20 |
| 2019/0164492 A1* | 5/2019 | Oh | G09G 3/3258 |

\* cited by examiner

*Primary Examiner* — Tuan T Lam
(74) *Attorney, Agent, or Firm* — Polsinelli PC

(57) ABSTRACT

A gate shift register and an organic light emitting diode display including the same are disclosed. The gate shift register includes a first stage and a second stage that output image display gate pulses during an image data writing period and selectively output a sensing gate pulse in a vertical blanking interval in which image display data is not written. The first stage includes a node Q1, a node Qbo, a node M, a first sensing control block activating the node Q1, and a second sensing control block deactivating the node Qbo. The second stage includes a node Q2, a node Qbe, a third sensing control block activating the node Q2, and a fourth sensing control block deactivating the node Qbe. The first stage and the second stage share a partial circuit necessary for driving with each other.

22 Claims, 16 Drawing Sheets

GATE SHIFT REGISTER AND ORGANIC LIGHT EMITTING DIODE DISPLAY INCLUDING THE SAME

CROSS-REFERENCE TO RELATED APPLICATION

This application claims the benefit of Korea Patent Application No. 10-2017-0063176 filed on May 22, 2017, which is incorporated herein by reference in its entirety for all purposes as if fully set forth herein.

BACKGROUND

Field of the Disclosure

The present disclosure relates to a display device, and more particularly to a gate shift register for external compensation and an organic light emitting diode display including the same.

Description of the Background

An active matrix organic light emitting diode (OLED) display includes a plurality of OLEDs capable of emitting light by themselves and has many advantages, such as fast response time, high emission efficiency, high luminance, wide viewing angle, and the like.

An OLED serving as a self-emitting element includes an anode electrode, a cathode electrode, and an organic compound layer between the anode electrode and the cathode electrode. The organic compound layer includes a hole injection layer HIL, a hole transport layer HTL, an emission layer EML, an electron transport layer ETL, and an electron injection layer EIL. When a driving voltage is applied to the anode electrode and the cathode electrode, holes passing through the hole transport layer HTL and electrons passing through the electron transport layer ETL move to the emission layer EML and form excitons. As a result, the emission layer EML generates visible light.

An OLED display has arranged pixels each including an OLED in a matrix form and adjusts a luminance of the pixels depending on gray levels of image display data. Each pixel includes a driving element (for example, a driving transistor) controlling a driving current flowing in the OLED depending on a voltage between a gate electrode and a source electrode. Electrical characteristics of the driving element vary due to operation temperature or deterioration. When there is a difference in the electrical characteristics of the driving elements between the pixels, the pixels have different luminances with respect to the same image display data. Hence, the OLED display has a difficulty in implementing a desired image.

An external compensation technology is known to compensate for change in electrical characteristics of the driving element. The external compensation technology senses the electrical characteristics of the driving element and modifies image display data by change in the electrical characteristics of the driving element based on a sensing result.

In order to compensate for change in characteristics of the driving element over time, electrical characteristics of the driving element need to be sensed in real time during a driving period of the driving element. Such a real-time sensing process performs a sensing operation in a vertical blanking interval excluding an image data writing period from one frame and senses a specific pixel line in each frame. The pixel line indicates a set of horizontally adjacent pixels, and as many pixels as a horizontal resolution are arranged on one pixel line. A panel driving circuit sequentially supplies image display gate pulses to gate lines of a display panel during the image data writing period and writes image display data to all the pixels of the display panel. In the vertical blanking interval, the panel driving circuit supplies sensing gate pulse to only gate line connected to the specific pixel line and writes sensing data to pixels of the specific pixel line.

The real-time sensing process connects a sensing circuit to one electrode of the driving element to thereby sense a current flowing in the driving element. The OLEDs of a corresponding pixel line to be sensed are designed not to emit light, in order to perform the accurate sensing. Because an emission duty of the corresponding pixel line during the sensing period is reduced by a length of the vertical blanking interval, a luminance variation between the sensed pixel line and a non-sensed pixel line may occur. As a result, the sensed pixel line may be visible as line dim.

It may be necessary that the sensing gate pulses are applied to pixel lines to be sensed in random order, in order to reduce a line dim perception phenomenon. However, configuration of a gate shift register becomes complicated when the gate shift register generates the sensing gate pulses in random order. When the gate shift register of the complicated configuration is embedded in the display panel, the size of a bezel area increases. Further, power consumption increases due to an increase in the number of clock lines and power lines.

SUMMARY

Accordingly, the present disclosure is to address the above-described and other problems and provide a gate shift register and an organic light emitting diode display including the same capable of outputting sensing gate pulses in random order in a vertical blanking interval through a simple circuit configuration.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

In one aspect, there is provided a gate shift register comprising a first stage and a second stage configured to output an image display gate pulse during an image data writing period and selectively output a sensing gate pulse in a vertical blanking interval in which the image display data is not written, wherein the first stage includes a node Q1, a node Qbo, and a node M, a first sensing control block configured to activate the node Q1 in accordance with a voltage of the node M and a global reset signal, and a second sensing control block configured to deactivate the node Qbo in accordance with the voltage of the node M and the global reset signal, wherein the second stage includes a node Q2 and a node Qbe, a third sensing control block configured to activate the node Q2 in accordance with the voltage of the node M and the global reset signal, and a fourth sensing control block configured to deactivate the node Qbe in accordance with the voltage of the node M and the global reset signal, wherein the first stage and the second stage share a partial circuit necessary for driving with each other.

BRIEF DESCRIPTION OF THE DRAWINGS

The accompanying drawings, that may be included to provide a further understanding of the disclosure and are incorporated in and constitute a part of this application, illustrate aspects of the disclosure and together with the description serve to explain various principles of the disclosure.

In the drawings.

DETAILED DESCRIPTION

Reference will now be made in detail to aspects of the disclosure, examples of which are illustrated in the accompanying drawings. Wherever possible, the same reference numbers will be used throughout the drawings to refer to the same or like parts. Detailed descriptions of known arts will be omitted if such may mislead the aspects of the disclosure.

In aspects disclosed herein, "preceding stages" are stages that are positioned above a reference stage and generate gate output signals having a phase earlier than a phase of a gate output signal output from the reference stage. Further, "subsequent stages" are stages that are positioned below a reference stage and generate gate output signals having a phase later than a phase of a gate output signal output from the reference stage. In addition, switching elements constituting a gate shift register according to aspects of the disclosure may be implemented as at least one of an oxide element, an amorphous silicon element, and a polycrystalline silicon element. The fact that a node is activated indicates that the node is charged with a high potential power voltage or a voltage corresponding to the high potential power voltage. The fact that a node is deactivated indicates that the node is charged with a low potential power voltage or a voltage corresponding to the low potential power voltage.

Figure 1:
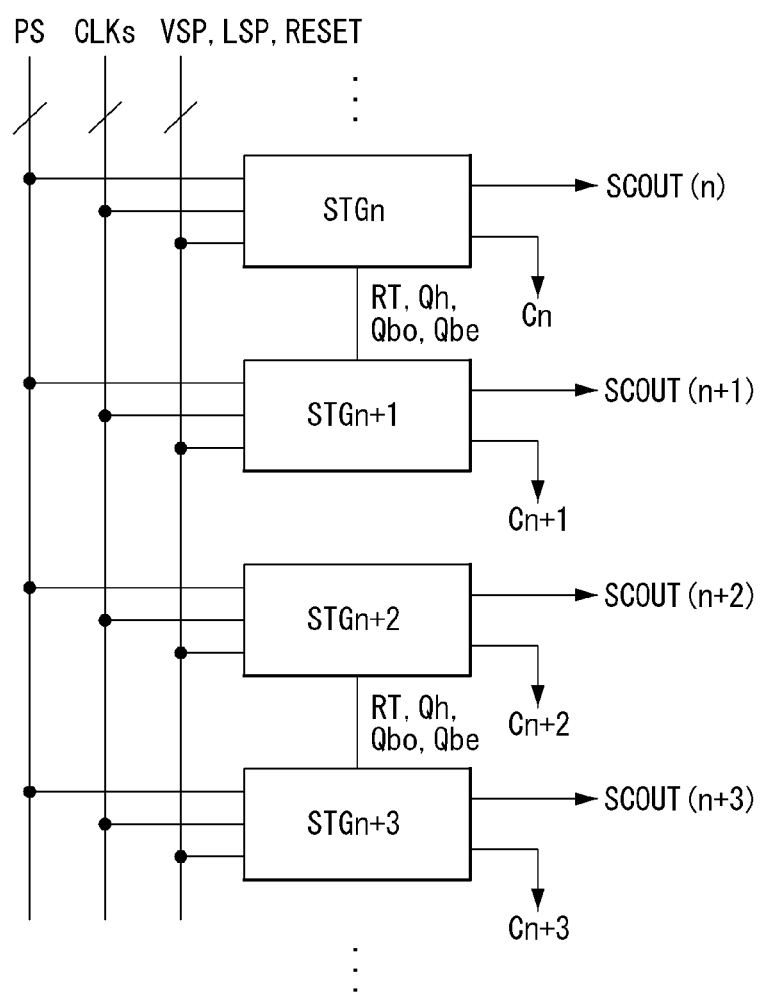
FIG. 1 illustrates a connection configuration of stages of a gate shift register according to an aspect of the present disclosure.

FIG. 1 illustrates a connection configuration of stages of a gate shift register according to an aspect of the disclosure.

Referring to FIG. 1, a gate shift register according to an aspect of the disclosure includes a plurality of stages STGn to STGn+3 that are cascade-connected to one another. An uppermost stage may be further connected to at least one preceding dummy stage, and a lowermost stage may be further connected to at least one subsequent dummy stage.

The stages STGn to STGn+3 each generate a gate output signal and a carry signal. The gate output signal may include an image display gate pulse and a sensing gate pulse. The stages STGn to STGn+3 generate image display gate pulses SCOUT(n) to SCOUT(n+3) and supply the image display gate pulses SCOUT(n) to SCOUT(n+3) to gate lines disposed on each pixel line of a display panel. The stages STGn to STGn+3 generate carry signals Cn to Cn+3 and may supply the carry signals Cn to Cn+3 to one of preceding stages. Further, the stages STGn to STGn+3 may be configured such that any one stage generates a sensing gate pulse (e.g., one of SCOUT(n) to SCOUT(n+3)) in each frame and supplies the sensing gate pulse to gate line disposed on a specific pixel line of the display panel. The stage generating the sensing gate pulse in each frame may be set randomly.

The stages STGn to STGn+3 may receive a global start signal VSP, a global reset signal RESET, a line sampling signal LSP, a clock signal CLKs, etc. from an external timing controller (not shown) to generate the gate output signals and the carry signals.

The global start signal VSP, the global reset signal RESET, the line sampling signal LSP, and the clock signal CLKs are commonly supplied to the stages STGn to STGn+3. The global start signal VSP may be further supplied to a start terminal of the preceding dummy stage, and the global reset signal RESET may be further supplied to a reset terminal of the subsequent dummy stage.

The stages STGn to STGn+3 each activate an operation of a node Q in response to the carry signal applied to a start terminal of each stage in each frame. In this instance, some of the stages STGn to STGn+3 may receive the carry signal from the preceding dummy stage. The preceding dummy stage may operate in response to the global start signal VSP and supply the carry signal to some subsequent stages.

The stages STGn to STGn+3 each deactivate an operation of the node Q in response to a reset signal applied to a reset terminal of each stage in each frame. In this instance, some of the stages STGn to STGn+3 may receive the reset signal from the subsequent dummy stage. The subsequent dummy stage may operate in response to the global reset signal RESET and supply the reset signal to some preceding stages.

At least one clock signal CLKs may be supplied to each of the stages STGn to STGn+3. The clock signal CLKs may include scan shift clocks, of which phases are sequentially shifted, and carry shift clocks, of which phases are sequentially shifted. The scan shift clocks are clock signals for generating the image display gate pulse and the sensing gate pulse, and the carry shift clocks are clock signals for generating the carry signal. The scan shift clocks swing between a gate high voltage and a gate low voltage so that they are synchronized with the image display gate pulses during an image data writing period. The scan shift clocks swing between the gate high voltage and the gate low voltage so that they are synchronize with the sensing gate pulses in a vertical blanking interval. During the image data writing period, all the scan shift clocks swing. In the vertical blanking interval, some scan shift clocks swing, and the remaining scan shift clocks holds the gate low voltage.

The clock signals CLKs can be driven in an overlap manner in order to secure a sufficient charge time in a high-speed drive. The clocks of the neighboring phases in accordance with the overlap driving may be overlapped by a predetermined high level period.

The stages STGn to STGn+3 may sequentially output the image display gate pulses in synchronization with the scan shift clocks. One of the stages STGn to STGn+3 may output the sensing gate pulse in synchronization with some scan shift clocks.

Each of the stages STGn to STGn+3 may receive a power voltage PS from an external power supply unit (not shown). The power voltage PS includes a high potential power voltage and a low potential power voltage. The high potential power voltage may be set to the gate high voltage, for example, 28V. The low potential power voltage may be set to a plurality of gate low voltages, for example, −6V and −12V, in order to suppress a leakage current of transistors included in each of the stages STGn to STGn+3.

In this instance, the scan shift clocks may swing between −6V and 12V, and the carry shift clocks may swing between −12V and 12V. In other words, a swing width of the carry shift clocks is greater than a swing width of the scan shift clocks.

To implement a simple circuit configuration of the stages STGn to STGn+3, the two adjacent stages (e.g., the stages STGn and STGn+1, and the stages STGn+2 and STGn+3) may share a part of a sensing control block RT, a node Qh, a node Qbo, and a node Qbe with each other.

The stages STGn to STGn+3 alternately drive the node Qbo and the node Qbe at intervals of predetermined time to thereby reduce the deterioration of transistors switched in response to voltages of the node Qbo and the node Qbe. In this instance, the high potential power voltages applied to inverter blocks of the stages STGn to STGn+3 may be AC-driven.

Figure 2:
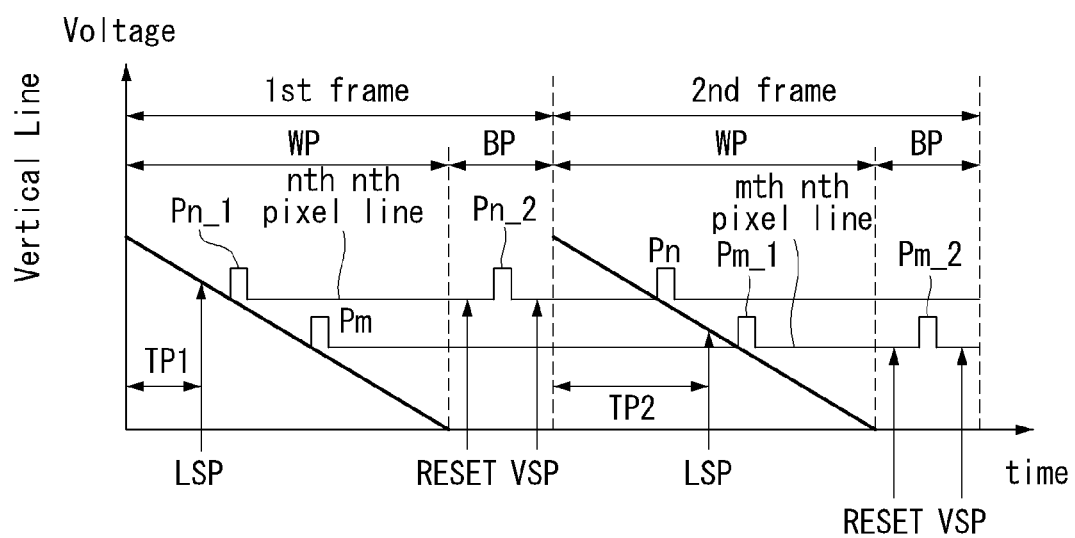
FIGS. 2 and 3 illustrate a timing, at which a line sampling signal, a global reset signal, and a global start signal are applied, and output timings of an image display gate pulse and a sensing gate pulse.
Figure 3:
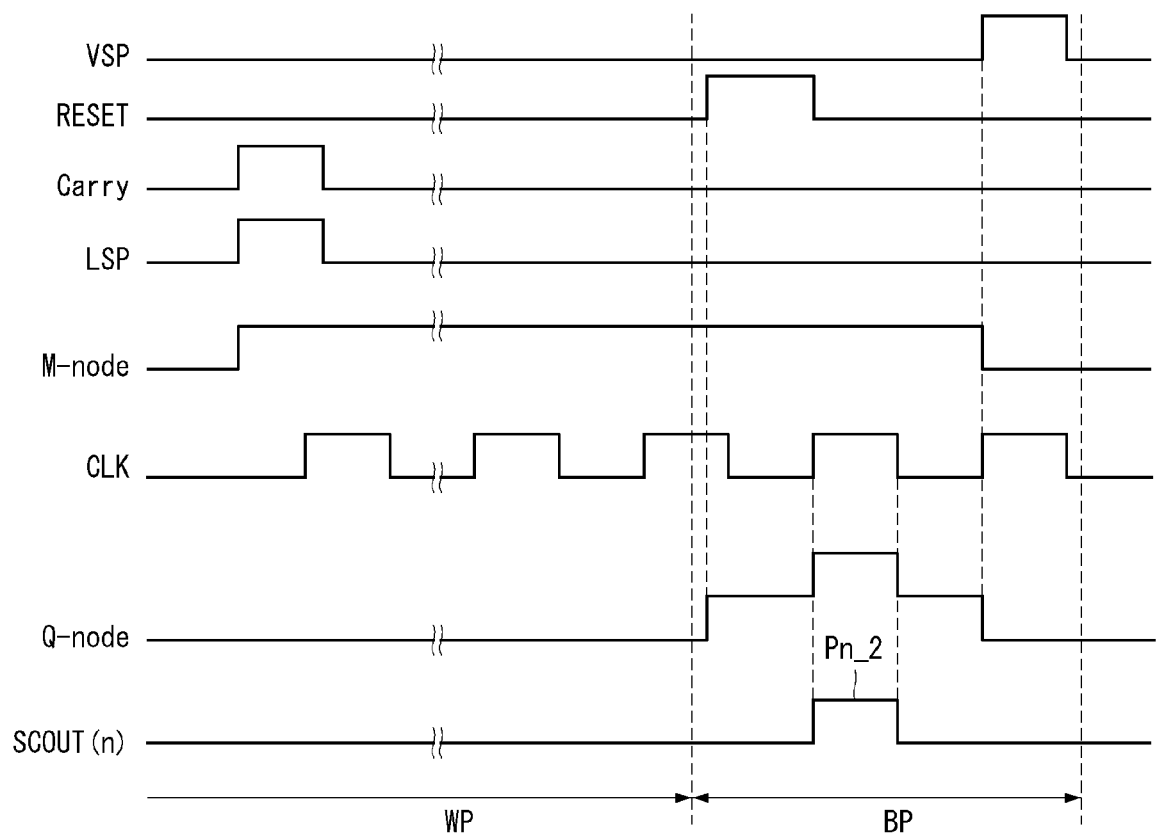

FIGS. 2 and 3 illustrate a timing, at which the line sampling signal LSP, the global reset signal RESET, and the global start signal VSP are applied, and output timings of the image display gate pulse and the sensing gate pulse.

Referring to FIG. 2, the image display gate pulse is a scan control signal for selecting a pixel line to which image display data will be written, and the sensing gate pulse is a scan control signal for selecting a pixel line to which sensing data will be written. The sensing data is data for sensing electrical characteristics of the pixels included in the display panel and is data which is not related to the image display.

Referring to FIG. 2, the stages may output image display gate pulses, of which phases are sequentially shifted, during an image data writing period WP of one frame. For example, during image data writing periods WP of first and second frames, an image display gate pulse Pn_1 may be output from an n-th stage and supplied to an n-th pixel line, and an image display gate pulse Pm may be output from an m-th stage and supplied to an m-th pixel line.

On the other hand, the sensing gate pulse may be output from one of the plurality of stages in a vertical blanking interval BP of one frame in which image display data is not written. A pixel line (or referred to as "sensing target pixel line"), to which sensing data will be written, may be selected non-sequentially or randomly to reduce visibility. Thus, any one stage outputs one sensing gate pulse in each vertical blanking interval BP, and the stage outputting the sensing gate pulse is selected non-sequentially or randomly. For example, a sensing gate pulse Pn_2 may be output from the n-th stage and supplied to the n-th pixel line in a vertical blanking interval BP of the first frame. Further, a sensing gate pulse Pm_2 may be output from the m-th stage and supplied to the m-th pixel line in a vertical blanking interval BP of the second frame. Other pixel lines may be disposed between the n-th pixel line and the m-th pixel line when the random sensing is implemented.

Referring to FIGS. 2 and 3, the line sampling signal LSP is randomly generated in an image data writing period WP of each frame. Because the line sampling signal LSP is randomly generated, frames have different intervals TP1 and TP2 from a start time of one frame to an input start time of the line sampling signal LSP in the one frame. Furthermore, the intervals TP1 and TP2 are irregular in the frames. In other words, the line sampling signals LSP are applied at irregular intervals in the frames.

A sensing target pixel line, to which sensing data will be written in a corresponding frame, is selected in response to the line sampling signal LSP, the carry signal, the global reset signal RESET, and the global start signal VSP. A stage receiving a carry signal synchronized with the line sampling signal LSP activates a voltage of a node M included in a sampling block of the stage in an image data writing period WP and holds the activation voltage of the node M until a vertical blanking interval BP. Further, the stage activates a node Q included in the stage in accordance with the activation voltage of the node M and the global reset signal RESET in the vertical blanking interval BP, thereby outputting a sensing gate pulse.

For example, when the line sampling signal LSP is synchronized with the carry signal input to the n-th stage in the first frame, the n-th stage outputs the sensing gate pulse Pn_2 in the vertical blanking interval BP of the first frame, and the remaining stages output no sensing gate pulse in the vertical blanking interval BP of the first frame. To this end, after a voltage of a node M included in the n-th stage is activated in response to the line sampling signal LSP in the image data writing periods WP of the first frame, the node M is held at the activation voltage until the global start signal VSP is input in the vertical blanking interval BP of the first frame. The n-th stage activates a node Q included in the n-th stage in response to the activation voltage of the node M and the global reset signal RESET in the vertical blanking interval BP of the first frame and outputs the sensing gate pulse Pn_2 synchronized with the clock signal to an n-th gate line. Hence, the n-th pixel line connected to the n-th gate line operates in response to the sensing gate pulse Pn_2. Further, the node Q and the node M of the n-th stage are deactivated in response to the global start signal VSP in the vertical blanking interval BP of the first frame. Such an initialization operation can allow the n-th stage to normally generate an image display gate pulse in the second frame.

Further, when the line sampling signal LSP is synchronized with the carry signal input to the m-th stage in the second frame, the m-th stage outputs the sensing gate pulse Pm_2 in the vertical blanking interval BP of the second frame, and the remaining stages output no sensing gate pulse in the vertical blanking interval BP of the second frame. To this end, after a voltage of a node M included in the m-th stage is activated in response to the line sampling signal LSP in the image data writing periods WP of the second frame, the node M is held at the activation voltage until the global start signal VSP is input in the vertical blanking interval BP of the second frame. The m-th stage activates a node Q included in the m-th stage in response to the activation voltage of the node M and the global reset signal RESET in the vertical blanking interval BP of the second frame and outputs the sensing gate pulse Pm_2 synchronized with the clock signal to an m-th gate line. Hence, the m-th pixel line connected to the m-th gate line operates in response to the sensing gate pulse Pm_2. Further, the node Q and the node M of the m-th stage are deactivated in response to the global start signal VSP in the vertical blanking interval BP of the second frame. Such an initialization operation can allow the m-th stage to normally generate an image display gate pulse in a subsequent frame.

Referring again to FIGS. 2 and 3, in the image data writing period WP of each of the first and second frames, the remaining stages receiving the carry signals that are not synchronized with the line sampling signal LSP cannot activate nodes M of the remaining stages. Therefore, in the vertical blanking interval BP of each of the first and second frames, the remaining stages cannot activate nodes Q of the remaining stages and thus cannot output the sensing gate pulse.

Figure 4:
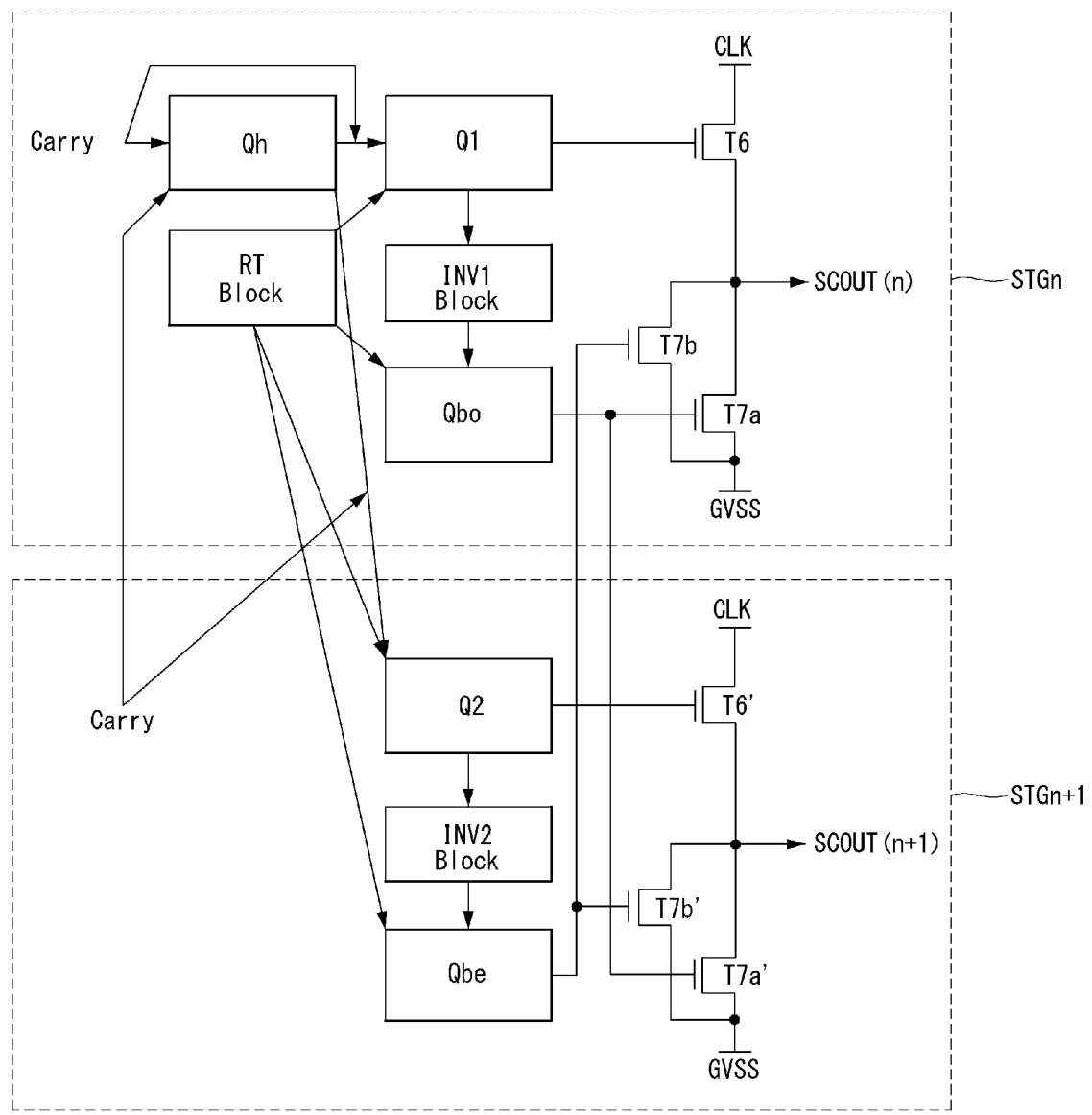
FIG. 4 schematically illustrates two stages that share a portion of a circuit configuration with each other.

FIG. 4 schematically illustrates two stages that share a portion of a circuit configuration with each other.

Referring to FIG. 4, two adjacent stages STGn and STGn+1 may share a part of a sensing control block RT, a node Qh, a node Qbo, and a node Qbe with each other.

The sensing control block RT is necessary to perform the random sensing. When the two stages STGn and STGn+1 share a part of the sensing control block RT including a node M with each other, a circuit configuration of the stages can be simplified. Even when the circuit configuration of the stages is simplified as described above, the stages can normally operate.

When an alternate drive is performed using two Qb nodes, the circuit configuration of the stages is simplified when the two stages STGn and STGn+1 share a node Qh, a node Qbo, and a node Qbe with each other. Even when the circuit configuration of the stages is simplified as described above, the stages can normally operate. The node Qbo and the node Qbe are alternately driven at intervals of predetermined time for the alternate drive. For example, when the node Qbo is driven in a first interval, the node Qbe may be pause-driven in the first interval. When the node Qbe is driven in a second interval following the first interval, the node Qbo may be pause-driven in the second interval. In this instance, in the first interval, a voltage of the node Qbo swings between a discharge level and a charge level, and a voltage of the node Qbe is held at the discharge level. In the second interval, a voltage of the node Qbe swings between the discharge level and the charge level, and a voltage of the node Qbo is held at the discharge level.

As shown in FIG. 4, the stage STGn may include a first inverter block INV1 for controlling voltages of a node Q1 and the node Qbo and transistors T6, T7a and T7b included in an output block. The transistor T6 is a pull-up transistor that is turned on for a relatively short period of time in which the voltage of the node Q1 is held at a boosting voltage level.

On the other hand, the transistors T7a and T7b are pull-down transistors that are turned on for a very long time and can be relatively quickly deteriorated. The transistors T7a and T7b may be alternately driven at intervals of predetermined time to reduce a deterioration speed. To this end, the transistor T7a may be designed to be turned on in response to the voltage of the node Qbo, and the transistor T7b may be designed to be turned on in response to the voltage of the node Qbe. Thus, when the transistor T7a is driven, the transistor T7b is pause-driven. On the contrary, when the transistor T7b is driven, the transistor T7a is pause-driven.

As shown in FIG. 4, the stage STGn+1 may include a second inverter block INV2 for controlling voltages of a node Q2 and the node Qbe and transistors T6', T7a' and T7b' included in an output block. The transistor T6' is a pull-up transistor that is turned on for a relatively short period of time in which the voltage of the node Q2 is held at a boosting voltage level.

On the other hand, the transistors T7a' and T7b' are pull-down transistors that are turned on for a very long time and are relatively quickly deteriorated. The transistors T7a' and T7b' may be alternately driven at intervals of predetermined time to reduce a deterioration speed. To this end, the transistor T7a' may be designed to be turned on in response to the voltage of the node Qbo, and the transistor T7b' may be designed to be turned on in response to the voltage of the node Qbe. Thus, when the transistor T7a' is driven, the transistor T7b' is pause-driven. On the contrary, when the transistor T7b' is driven, the transistor T7a' is pause-driven.

Figure 5:
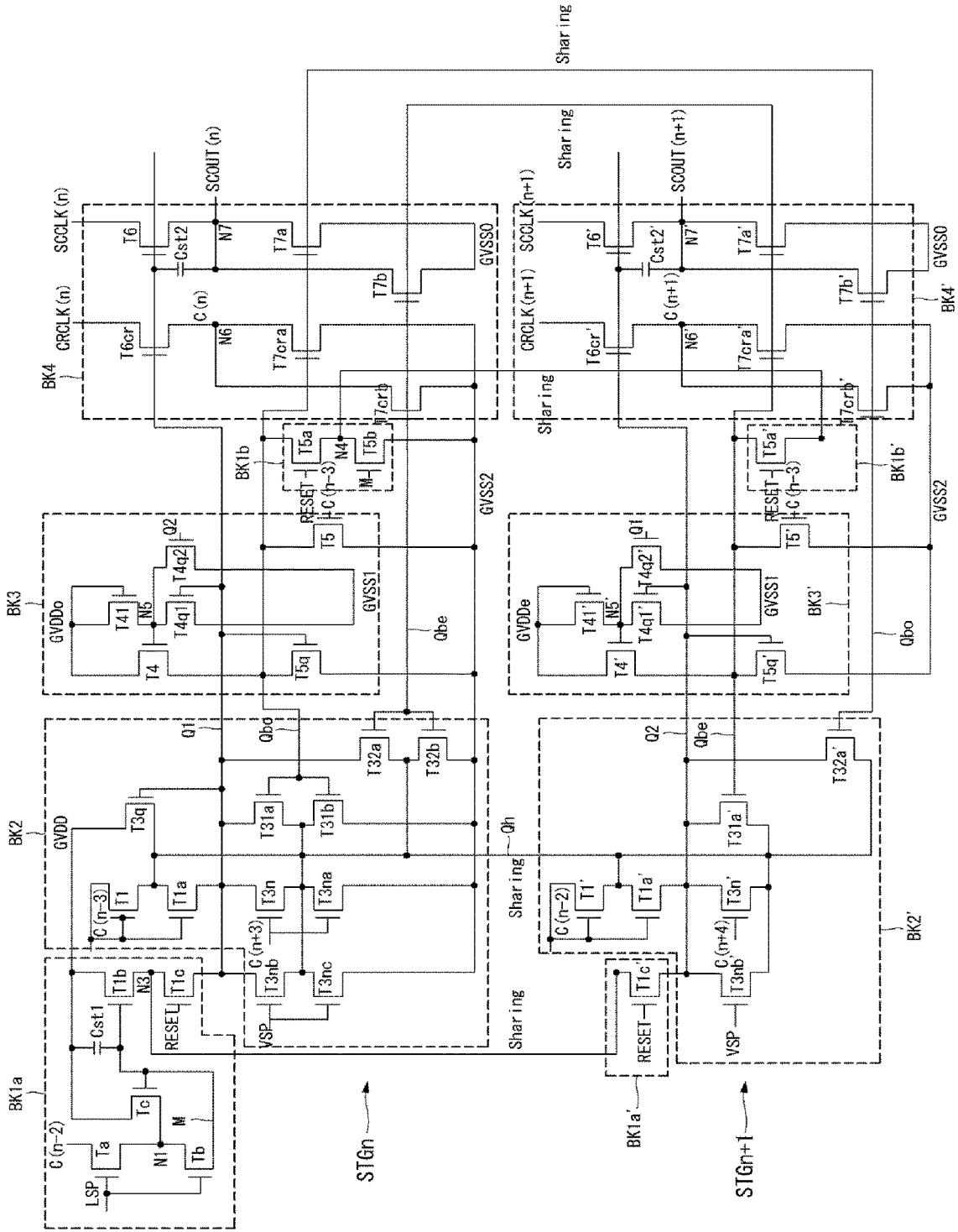
FIG. 5 illustrates in detail stages shown in FIG. 4.
Figure 6:
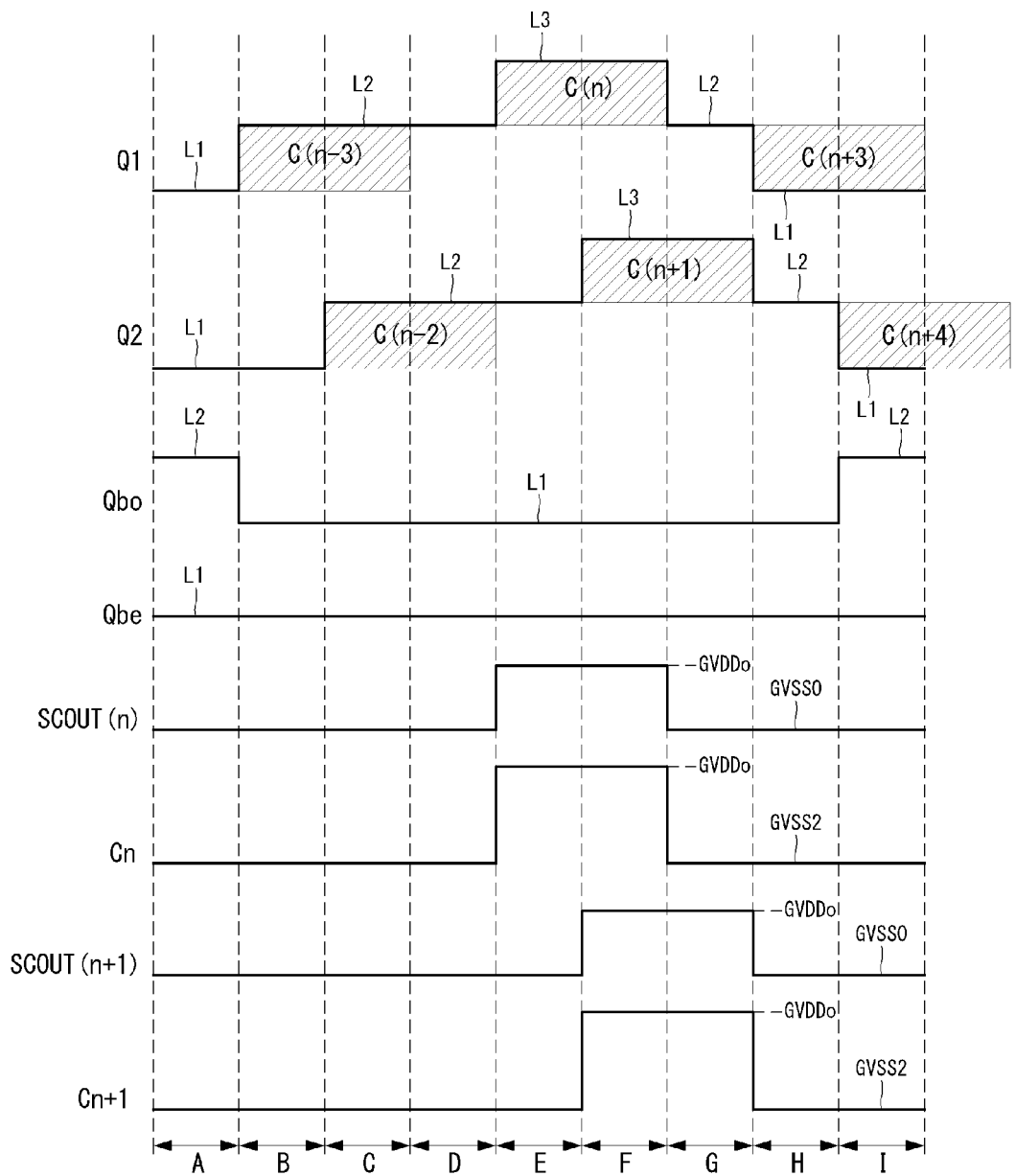
FIG. 6 illustrates voltages of a node Q1, a node Q2, a node Qbo, and a node Qbe included in stages shown in FIG. 5 and an image display gate pulse and a carry signal output from the stages.

FIG. 5 illustrates in detail the stages STGn and STGn+1 shown in FIG. 4. FIG. 6 illustrates voltages of a node Q1, a node Q2, a node Qbo, and a node Qbe included in the stages STGn and STGn+1 shown in FIG. 5 and an image display gate pulse and a carry signal output from the stages STGn and STGn+1.

In FIGS. 5 and 6, "GVDD" denotes a high potential power voltage of a voltage level L2, and power voltages GVDDo and GVDDe may swing between voltage levels L1 and L2 for AC drive. The voltage level L1 may be substantially equal to a low potential power voltage GVSS2. A low potential power voltage GVSS0 may be set to be higher than the low potential power voltage GVSS2. When the low potential power voltage GVSS0 is set to be higher than the low potential power voltage GVSS2 as described above, off-currents of transistors T31a, T31b, T32a, T32b, T7cra, T7a, T7crb and T7b, of which gate electrodes are connected to a node Qbo and a node Qbe, can be completely blocked. A low potential power voltage GVSS1 may be set to be substantially equal to the low potential power voltage GVSS0.

Referring to FIGS. 5 and 6, the stage STGn includes a first sensing control block BK1a, a second sensing control block BK1b, an input block BK2, an inverter block BK3, and an output block BK4.

The first sensing control block BK1a applies a carry signal C(n−2) to a node M in response to the line sampling signal LSP to activate a voltage of the node M to the high potential power voltage GVDD and to activate a voltage of a node Q1 to the high potential power voltage GVDD in response to the activation voltage of the node M and the global reset signal RESET.

To this end, the first sensing control block BK1a includes a plurality of transistors Ta, Tb, Tc, T1b and T1c and a capacitor Cst1. The transistor Ta includes a gate electrode supplied with the line sampling signal LSP, a drain electrode supplied with a carry signal C(n−2), and a source electrode connected to a node N1. The transistor Tb includes a gate electrode supplied with the line sampling signal LSP, a drain electrode connected to the node N1, and a source electrode connected to the node M. The transistor Tc includes a gate electrode connected to a node N2, a drain electrode supplied with the high potential power voltage GVDD, and a source electrode connected to the node N1. The transistor T1b includes a gate electrode connected to the node N2, a drain electrode supplied with the high potential power voltage GVDD, and a source electrode connected to a node N3. The capacitor Cst1 is connected between an input terminal of the high potential power voltage GVDD and the node N2 and holds the activation voltage of the node M. The transistor T1c includes a gate electrode supplied with the global reset signal RESET, a drain electrode connected to the node N3, and a source electrode connected to the node Q1.

The second sensing control block BK1b deactivates a voltage of the node Qbo to the low potential power voltage GVSS2 in response to the global reset signal RESET and the voltage of the node M.

To this end, the second sensing control block BK1b includes a plurality of transistors T5a and T5b. The transistor T5a includes a gate electrode supplied with the global reset signal RESET, a drain electrode connected to the node Qbo, and a source electrode connected to a node N4. The transistor T5b includes a gate electrode connected to the node M, a drain electrode connected to the node N4, and a source electrode supplied with the low potential power voltage GVSS2.

The input block BK2 applies a carry signal C(n−3) to the node Q1 to activate a voltage of a node Qh to the high potential power voltage GVDD. The second sensing control block BK1b deactivates the voltage of the node Q1 to the low potential power voltage GVSS2 in response to a carry signal C(n+3). The second sensing control block BK1b deactivates the voltage of the node Q1 to the low potential power voltage GVSS2 in accordance with the voltage of the node Qbo or the voltage of the node Qbe. The second sensing control block BK1b deactivates the voltage of the node Q1 to the low potential power voltage GVSS2 in response to the global start signal VSP.

To this end, the input block BK2 includes a plurality of transistors T1, T1a, T3q, T3n, T3na, T31a, T31b, T32a, T32b, T3nb and T3nc. The transistor T1 includes a gate electrode and a drain electrode each of which is supplied with the carry signal C(n−3), and a source electrode connected to the node Qh. The transistor T1a includes a gate electrode supplied with the carry signal C(n−3), a drain electrode connected to the node Qh, and a source electrode connected to the node Q1. The transistor T3q includes a gate electrode connected to the node Q1, a drain electrode supplied with the high potential power voltage GVDD, and a source electrode connected to the node Qh. The transistor T3n includes a gate electrode supplied with the carry signal C(n+3), a drain electrode connected to the node Q1, and a source electrode connected to the node Qh. The transistor T3na includes a gate electrode supplied with the carry signal C(n+3), a drain electrode connected to the node Qh, and a source electrode supplied with the low potential power voltage GVSS2. The transistor T31a includes a gate electrode connected to the node Qbo, a drain electrode connected to the node Q1, and a source electrode connected to the node Qh. The transistor T31b includes a gate electrode connected to the node Qbo, a drain electrode connected to the node Qh, and a source electrode supplied with the low potential power voltage GVSS2. The transistor T32a includes a gate electrode connected to the node Qbe, a drain electrode connected to the node Q1, and a source electrode connected to the node Qh. The transistor T32b includes a gate electrode connected to the node Qbe, a drain electrode connected to the node Qh, and a source electrode supplied with the low potential power voltage GVSS2. The transistor T3nb includes a gate electrode supplied with the global start signal VSP, a drain electrode connected to the node Q1, and a source electrode connected to the node Qh. The transistor T3nc includes a gate electrode supplied with the global start signal VSP, a drain electrode connected to the node Qh, and a source electrode connected to an input terminal of the low potential power voltage GVSS2.

The inverter block BK3 deactivates the voltage of the node Qbo to the low potential power voltage GVSS2 in response to the carry signal C(n−3). The inverter block BK3 deactivates the voltage of the node Qbo to the low potential power voltage GVSS2 in accordance with the activation voltage of the node Q1. The inverter block BK3 applies the power voltage GVDDo to a node N5 and activates the voltage of the node Qbo to the power voltage GVDDo. The inverter block BK3 deactivates a voltage of the node N5 to the low potential power voltage GVSS2 in accordance with the activation voltage of the node Q2.

To this end, the inverter block BK3 includes a plurality of transistors T4, T41, T4q1, T4q2, T5 and T5q. The transistor T4 includes a gate electrode connected to the node N5, a drain electrode supplied with the power voltage GVDDo, and a source electrode connected to the node Qbo. The transistor T41 includes a gate electrode and a drain electrode each of which is supplied with the power voltage GVDDo, and a source electrode connected to the node N5. The transistor T4q1 includes a gate electrode connected to the node Q1, a drain electrode connected to the node N5, and a source electrode connected to an input terminal of the low potential power voltage GVSS1. The transistor T4q2 includes a gate electrode connected to the node Q2, a drain electrode connected to the node N5, and a source electrode supplied with the low potential power voltage GVSS1. The transistor T5 includes a gate electrode supplied with the carry signal C(n−3), a drain electrode connected to the node Qbo, and a source electrode supplied with the low potential power voltage GVSS2. The transistor T5q includes a gate electrode connected to the node Q1, a drain electrode connected to the node Qbo, and a source electrode supplied with the low potential power voltage GVSS2.

The output block BK4 outputs a carry shift clock CRCLK(n) as a carry signal C(n) when the voltage of the node Q1 is boosted from the voltage level L2 to a voltage level L3. When the voltage of the node Qbo is activated to the voltage level L2, or the voltage of the node Qbe is activated to the voltage level L2, the output block BK4 outputs the low potential power voltage GVSS2 as the carry signal C(n). When the voltage of the node Q1 is boosted from the voltage level L2 to the voltage level L3, the output block BK4 outputs a scan shift clock SCCLK(n) as an image display gate pulse (or a sensing gate pulse) SCOUT(n). When the voltage of the node Qbo is activated to the voltage level L2, or the voltage of the node Qbe is activated to the voltage level L2, the output block BK4 outputs the low potential power voltage GVSS0 as the image display gate pulse (or the sensing gate pulse) SCOUT(n).

To this end, the output block BK4 includes a plurality of pull-up transistors T6cr and T6, a plurality of pull-down transistors T7cra, T7crb, T7a and T7b, and a capacitor Cst2. The pull-up transistor T6cr includes a gate electrode connected to the node Q1, a drain electrode supplied with the carry shift clock CRCLK(n), and a source electrode connected to a node N6. The pull-up transistor T6 includes a gate electrode connected to the node Q1, a drain electrode supplied with the scan shift clock SCCLK(n), and a source electrode connected to a node N7. The capacitor Cst2 is connected between the node Q1 and the node N7. The pull-down transistor T7cra includes a gate electrode connected to the node Qbo, a drain electrode connected to the node N6, and a source electrode connected to an input terminal of the low potential power voltage GVSS2. The pull-down transistor T7crb includes a gate electrode connected to the node Qbe, a drain electrode connected to the node N6, and a source electrode connected to the input terminal of the low potential power voltage GVSS2. The pull-down transistor T7a includes a gate electrode connected to the node Qbo, a drain electrode connected to the node N7, and a source electrode connected to an input terminal of the low potential power voltage GVSS0. The pull-down transistor T7b includes a gate electrode connected to the node Qbe, a drain electrode connected to the node N7, and a source electrode connected to the input terminal of the low potential power supply voltage GVSS0.

Referring again to FIGS. 5 and 6, the stage STGn+1 includes a first sensing control block BK1a', a second sensing control block BK1b', an input block BK2', an inverter block BK3', and an output block BK4'.

The first sensing control block BK1a' includes a transistor T1c' activating a voltage of a node Q2 to the high potential power voltage GVDD in response to the global reset signal RESET. The transistor T1c' includes a gate electrode supplied with the global reset signal RESET, a drain electrode connected to a node N3, and a source electrode connected to a node Q2.

The second sensing control block BK1b' deactivates a voltage of a node Qbe to the low potential power voltage GVSS2 in response to the global reset signal RESET and a voltage of a node M. To this end, the second sensing control block BK1b' includes a transistor T5a'. The transistor T5a' includes a gate electrode supplied with the global reset signal RESET, a drain electrode connected to the node Qbe, and a source electrode connected to a node Q4.

The input block BK2' applies a carry signal C(n−2) to the node Q2 and a node Qh and short-circuits the node Q2 and the node Qh in accordance with voltages of the node Qbe and a node Qbo. The input block BK2' short-circuits the node Q2 and the node Qh in response to the global start signal VSP and a carry signal C(n+4).

To this end, the input block BK2' includes a plurality of transistors T1', T1a', T3n', T3nb', T31a' and T32a'. The transistor T1' includes a gate electrode and a drain electrode each of which is supplied with the carry signal C(n−2), and a source electrode connected to the node Qh. The transistor T1a' includes a gate electrode supplied with the carry signal C(n−2), a drain electrode connected to the node Qh, and a source electrode connected to the node Q2. The transistor T3n' includes a gate electrode supplied with the carry signal C(n+4), a drain electrode connected to the node Q2, and a source electrode connected to the node Qh. The transistor T31a' includes a gate electrode connected to the node Qbe, a drain electrode connected to the node Q2, and a source electrode connected to the node Qh. The transistor T32a' includes a gate electrode connected to the node Qbo, a drain electrode connected to the node Q2, and a source electrode connected to the node Qh. The transistor T3nb' includes a gate electrode supplied with the global start signal VSP, a drain electrode connected to the node Q2, and a source electrode connected to the node Qh.

The inverter block BK3' deactivates the voltage of the node Qbe to the low potential power voltage GVSS2 in response to a carry signal C(n−3). The inverter block BK3' deactivates the voltage of the node Qbe to the low potential power voltage GVSS2 in accordance with the activation voltage of the node Q2. The inverter block BK3' applies the power voltage GVDDe to a node N5' and activates the voltage of the node Qbe to the power voltage GVDDe. The inverter block BK3' deactivates a voltage of the node N5' to the low potential power voltage GVSS2 in accordance with the activation voltage of the node Q1.

To this end, the inverter block BK3' includes a plurality of transistors T4', T41', T4q1', T4q2', T5' and T5q'. The transistor T4' includes a gate electrode connected to the node N5', a drain electrode supplied with the power voltage GVDDe, and a source electrode connected to the node Qbe. The transistor T41' includes a gate electrode and a drain electrode each of which is supplied with the power voltage GVDDe, and a source electrode connected to the node N5'. The transistor T4q1' includes a gate electrode connected to the node Q2, a drain electrode connected to the node N5', and a source electrode connected to the low potential power voltage GVSS1. The transistor T4q2' includes a gate electrode connected to the node Q1, a drain electrode connected to the node N5', and a source electrode supplied with the low potential power voltage GVSS1. The transistor T5' includes a gate electrode supplied with the carry signal C(n−3), a drain electrode connected to the node Qbe, and a source electrode supplied with the low potential power voltage GVSS2. The transistor T5q' includes a gate electrode connected to the node Q2, a drain electrode connected to the node Qbe, and a source electrode supplied with the low potential power voltage GVSS2.

The output block BK4' outputs a carry shift clock CRCLK(n+1) as a carry signal C(n+1) when the voltage of the node Q2 is boosted from a voltage level L2 to a voltage level L3. When the voltage of the node Qbo is activated to the voltage level L2, or the voltage of the node Qbe is activated to the voltage level L2, the output block BK4' outputs the low potential power voltage GVSS2 as the carry signal C(n+1). When the voltage of the node Q2 is boosted from the voltage level L2 to the voltage level L3, the output block BK4' outputs a scan shift clock SCCLK(n+1) as an image display gate pulse (or a sensing gate pulse) SCOUT(n+1). When the voltage of the node Qbo is activated to the voltage level L2, or the voltage of the node Qbe is activated to the voltage level L2, the output block BK4' outputs the low potential power voltage GVSS0 as the image display gate pulse (or the sensing gate pulse) SCOUT(n+1).

To this end, the output block BK4' includes a plurality of pull-up transistors T6cr' and T6', a plurality of pull-down transistors T7cra', T7crb', T7a' and T7b', and a capacitor Cst2'. The pull-up transistor T6cr' includes a gate electrode connected to the node Q2, a drain electrode supplied with the carry shift clock CRCLK(n+1), and a source electrode connected to a node N6'. The pull-up transistor T6' includes a gate electrode connected to the node Q2, a drain electrode supplied with the scan shift clock SCCLK(n+1), and a source electrode connected to the node N7'. The capacitor Cst2' is connected between the node Q2 and a node N7'. The pull-down transistor T7cra' includes a gate electrode connected to the node Qbe, a drain electrode connected to the node N6', and a source electrode connected to the input terminal of the low potential power voltage GVSS2. The pull-down transistor T7crb' includes a gate electrode connected to the node Qbo, a drain electrode connected to the node N6', and a source electrode connected to the input terminal of the low potential power voltage GVSS2. The pull-down transistor T7a' includes a gate electrode connected to the node Qbe, a drain electrode connected to the node N7', and a source electrode connected to the input terminal of the low potential power voltage GVSS0. The pull-down transistor T7b' includes a gate electrode connected to the node Qbo, a drain electrode connected to the node N7', and a source electrode connected to the input terminal of the low potential power voltage GVSS0.

FIG. 6 illustrates that the power voltage GVDDo is applied at the voltage level L2 and the power voltage GVDDe is applied at the voltage level L1 as an example of the AC drive. Aspects of the disclosure are equally applied to when the power voltage GVDDo is applied at the voltage level L1 and the power voltage GVDDe is applied at the voltage level L2.

Referring to FIG. 6, the voltage of the node Q1 increases from the voltage level L1 to the voltage level L2 in synchronization with the carry signal C(n−3). The voltage of the node Q1 is boosted from the voltage level L2 to the voltage level L3 in synchronization with the carry signal C(n) and then decreases from the voltage level L3 to the voltage level L2. Subsequently, the voltage of the node Q1 decreases from the voltage level L2 to the voltage level L1 in synchronization with the carry signal C(n+3).

The voltage of the node Q2 increases from the voltage level L1 to the voltage level L2 in synchronization with the carry signal C(n−2). The voltage of the node Q2 is boosted from the voltage level L2 to the voltage level L3 in synchronization with the carry signal C(n+1) and then decreases from the voltage level L3 to the voltage level L2. Subsequently, the voltage of the node Q2 decreases from the voltage level L2 to the voltage level L1 in synchronization with the carry signal C(n+4).

The voltage of the node Qbo decreases from the voltage level L2 to the voltage level L1 in synchronization with the carry signal C(n−3) and increases from the voltage level L1 to the voltage level L2 in synchronization with the carry signal C(n+4).

The voltage of the node Qbe is held at the voltage level L1.

In this instance, the image display gate pulse SCOUT(n) is output in synchronization with the carry signal C(n), and the image display gate pulse SCOUT(n+1) is output in synchronization with the carry signal C(n+1). An amplitude (between GVDDo and GVSS2) of the carry signals C(n) and C(n+1) is greater than an amplitude (between GVDDo and GVSS0) of the image display gate pulses SCOUT(n) and SCOUT(n+1).

FIGS. 7A to 7I sequentially illustrate operation processes of the gate shift register shown in FIGS. 5 and 6. More specifically, FIGS. 7A to 7I illustrate an output sequence of image display gate pulses and carry signals. An output sequence of sensing gate pulses was described above with reference to FIGS. 2 and 3. In FIGS. 7A to 7I, nodes having an activation voltage are indicated by thick lines, and nodes having a deactivation voltage are indicated by thin lines.

Figure 7A:
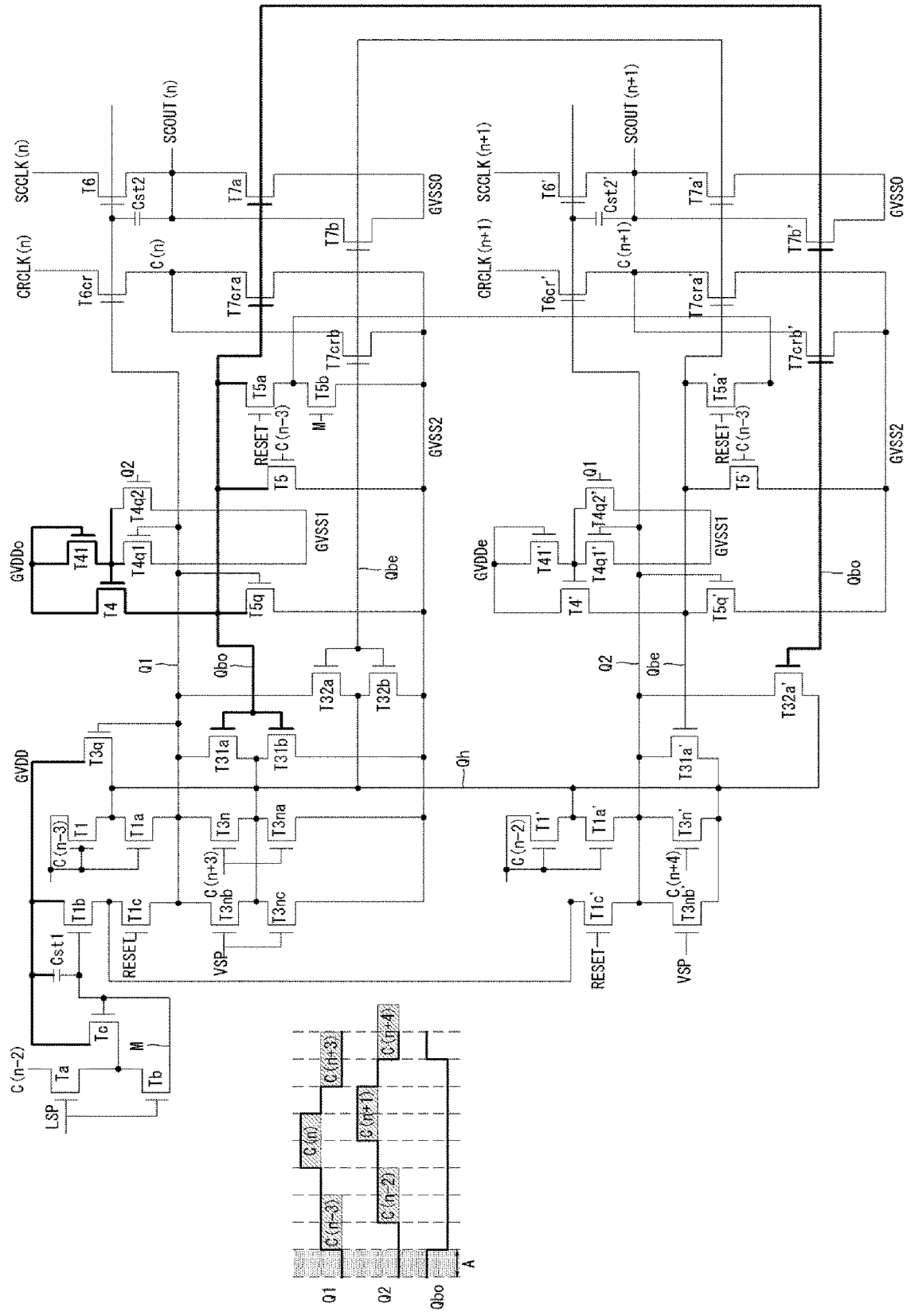
FIGS. 7A to 7I sequentially illustrate operation processes of a gate shift register shown in FIGS. 5 and 6.

Initially referring to FIG. 7A, during a period A, the voltage of the node Qbo increases to a voltage level L2 (GVDDo) by the turn-on of the transistors T4 and T41. In this instance, the transistors T31a and T32b, of which the gate electrodes are connected to the node Qbo, are turned on, and thus the voltages of the nodes Q1 and Qh are reduced to a voltage level L1(GVSS0). Further, the transistors T32a', of which the gate electrode is connected to the node Qbo, is turned on, and thus the node Q2 and the node Qh are connected to each other. Hence, the voltage of the node Q2 is reduced to the voltage level L1(GVSS0).

During the period A, as the pull-down transistors T7cra and T7a, of which the gate electrodes are connected to the node Qbo, are turned on, the voltage of the image display gate pulse SCOUT(n) is the low potential power voltage GVSS0, and the voltage of the carry signal C(n) is the low potential power voltage GVSS2. Further, as the pull-down transistors T7crb' and T7b', of which the gate electrodes are connected to the node Qbo, are turned on, the voltage of the image display gate pulse SCOUT(n+1) is the low potential power voltage GVSS0, and the voltage of the carry signal C(n+1) is the low potential power voltage GVSS2.

Figure 7B:
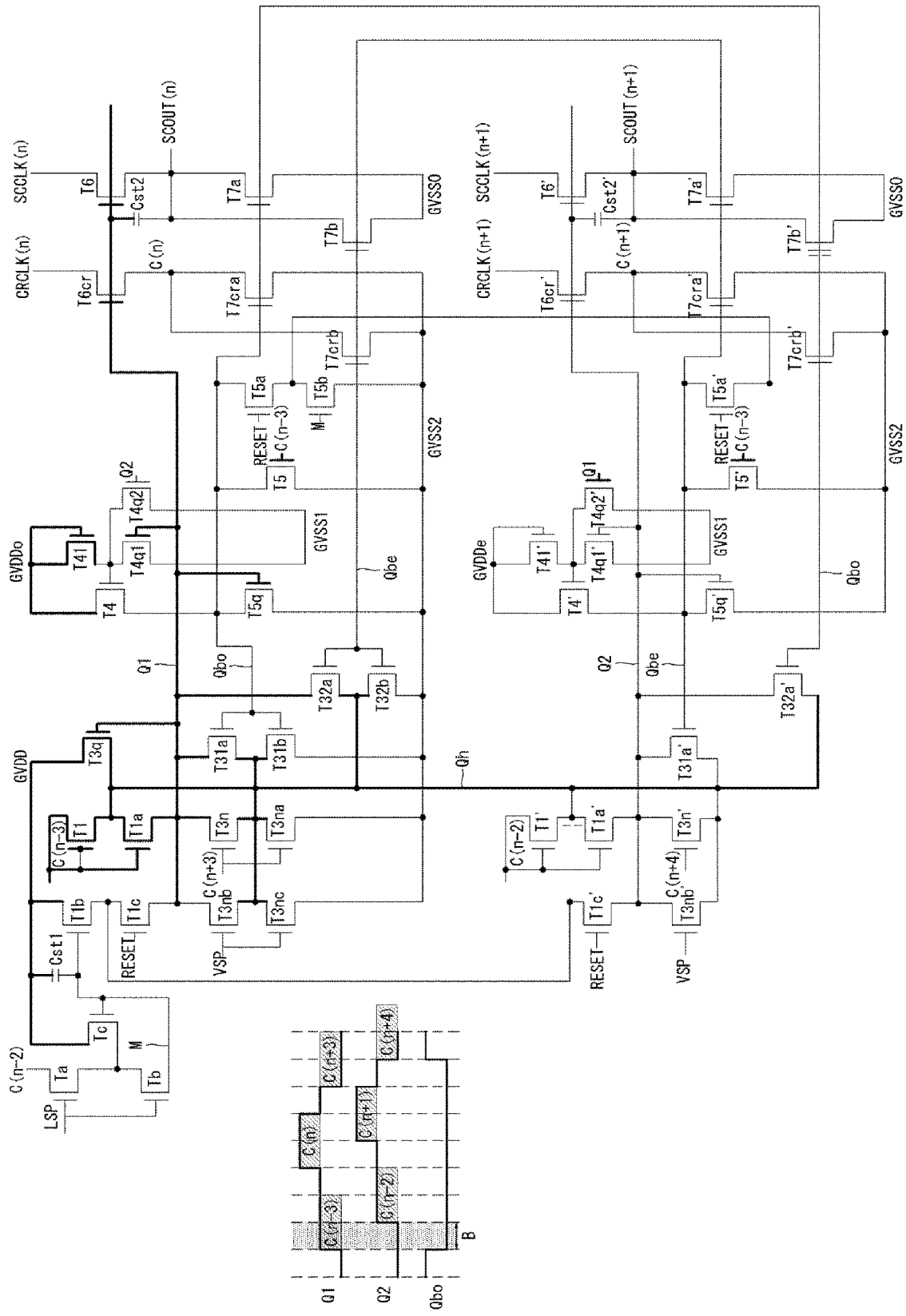

Referring to FIG. 7B, during a period B, when the carry signal C(n−3) having the voltage GVDDo is input, the voltage of the node Q1 increases to the voltage level L2(GVDDo) by the turn-on of the transistors T1 and T1a, and the voltage of the node Qbo is reduced to the voltage level L1(GVSS0) by the turn-on of the transistor T5. In this instance, the transistor T3q, of which the gate electrode is connected to the node Q1, is turned on, and thus the voltage of the node Qh increases to the voltage level L2(GVDDo). Further, the transistor T5q, of which the gate electrode is connected to the node Q1, is turned on, and thus the voltage of the node Qbo is held at the voltage level L1(GVSS0).

During the period B, the voltage of the scan shift clock SCCLK(n) is the low potential power voltage GVSS0, and the voltage of the carry shift clock CRCLK(n) is the low potential power voltage GVSS2. In this instance, because the pull-up transistors T6cr and T6, of which the gate electrodes are connected to the node Q1, have a high threshold voltage, the pull-up transistors T6cr and T6 maintain a turn-off state. Thus, the voltage of the image display gate pulse SCOUT(n) is the low potential power voltage GVSS0, and the voltage of the carry signal C(n) is the low potential power voltage GVSS2.

Figure 7C:
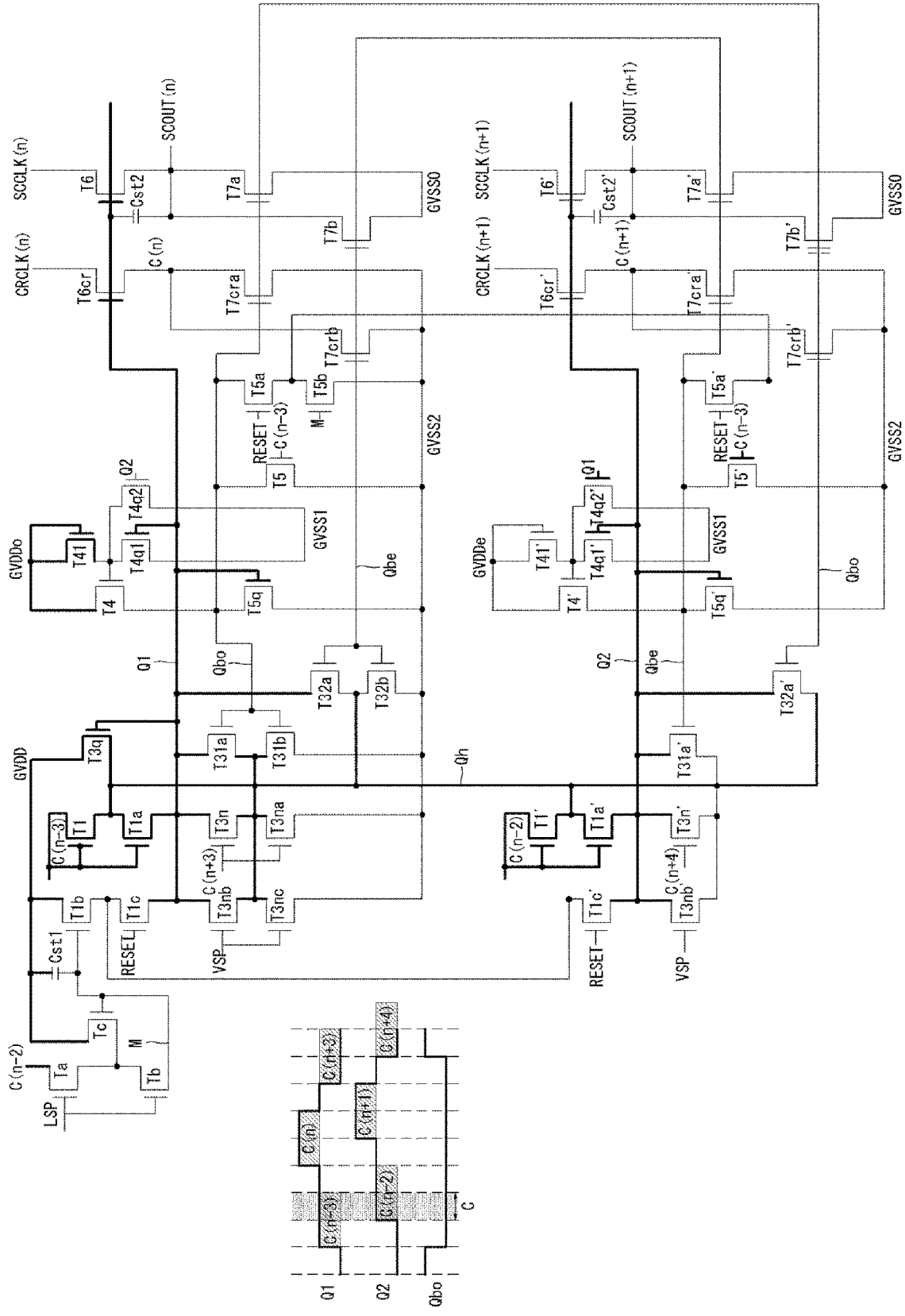

Referring to FIG. 7C, during a period C, the carry signals C(n−3) and C(n−2) each having the voltage GVDDo are input.

During the period C, the voltage of the node Q1 increases to the voltage level L2(GVDDo) by the turn-on of the transistors T1 and T1a in response to the carry signal C(n−3), and the voltage of the node Qbo is reduced to the voltage level L1(GVSS0) by the turn-on of the transistor T5. The transistor T3q, of which the gate electrode is connected to the node Q1, is turned on, and thus the voltage of the node Qh increases to the voltage level L2(GVDDo). Further, the transistor T5q, of which the gate electrode is connected to the node Q1, is turned on, and thus the voltage of the node Qbo is held at the voltage level L1(GVSS0).

During the period C, the voltage of the node Q2 increases to the voltage level L2(GVDDo) by the turn-on of the transistors T1' and T1a' in response to the carry signal C(n−2), and the voltage of the node Qbe is reduced to the voltage level L1(GVSS0) by the turn-on of the transistor T5'. The transistor T5q', of which the gate electrode is connected to the node Q2, holds the voltage of the node Qbe at the voltage level L1(GVSS0).

During the period C, the voltages of the scan shift clocks SCCLK(n) and SCCLK(n+1) are the low potential power voltage GVSS0, and the voltages of the carry shift clocks CRCLK(n) and CRCLK(n+1) are the low potential power voltage GVSS2. In this instance, the pull-up transistors T6cr and T6, of which the gate electrodes are connected to the node Q1, maintain a turn-off state, the voltage of the image display gate pulse SCOUT(n) is the low potential power voltage GVSS0, and the voltage of the carry signal C(n) is the low potential power voltage GVSS2. Further, the pull-up transistors T6cr' and T6', of which the gate electrodes are connected to the node Q2, maintain a turn-off state, the voltage of the image display gate pulse SCOUT(n+1) is the low potential power voltage GVSS0, and the voltage of the carry signal C(n+1) is the low potential power voltage GVSS2.

Figure 7D:
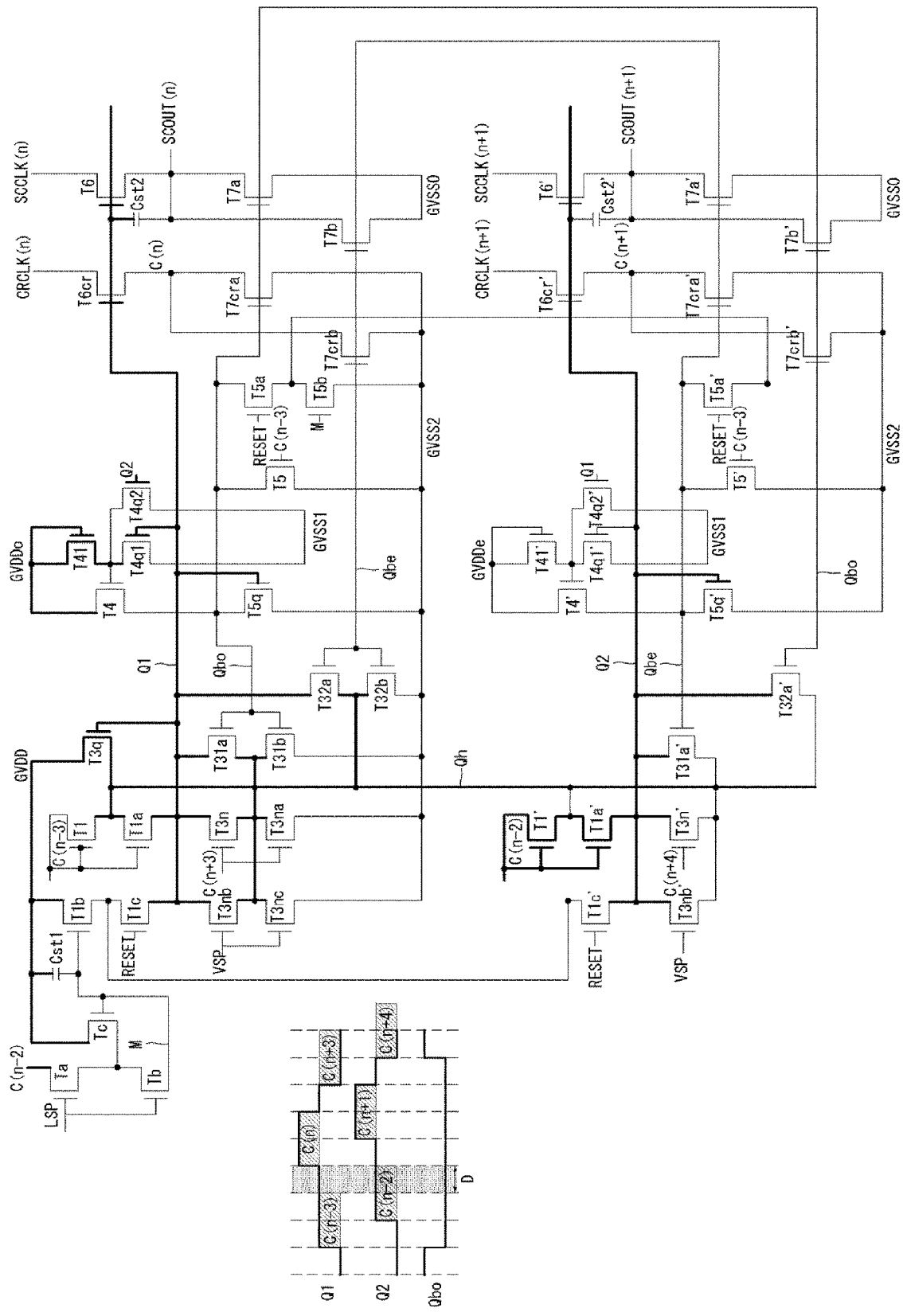

Referring to FIG. 7D, during a period D, the voltage of the carry signal C(n−3) is reduced from the GVDDo to the GVSS2, and the voltage of the carry signal C(n−2) is held at the GVDDo.

During the period D, the transistors T5 and T5' are turned off due to change in the voltage of the carry signal C(n−3). However, because the transistors T5q and T5q' maintain a turn-on state, the voltages of the nodes Qbo and Qbe are held at the voltage level L1(GVSS0).

During the period D, the voltages of the scan shift clocks SCCLK(n) and SCCLK(n+1) are the low potential power voltage GVSS0, and the voltages of the carry shift clocks CRCLK(n) and CRCLK(n+1) are the low potential power voltage GVSS2. In this instance, the pull-up transistors T6cr and T6, of which the gate electrodes are connected to the node Q1, maintain a turn-off state, the voltage of the image display gate pulse SCOUT(n) is the low potential power voltage GVSS0, and the voltage of the carry signal C(n) is the low potential power voltage GVSS2. Further, the pull-up transistors T6cr' and T6', of which the gate electrodes are connected to the node Q2, have a high threshold voltage and thus maintain a turn-off state, the voltage of the image display gate pulse SCOUT(n+1) is the low potential power voltage GVSS0, and the voltage of the carry signal C(n+1) is the low potential power voltage GVSS2.

Figure 7E:
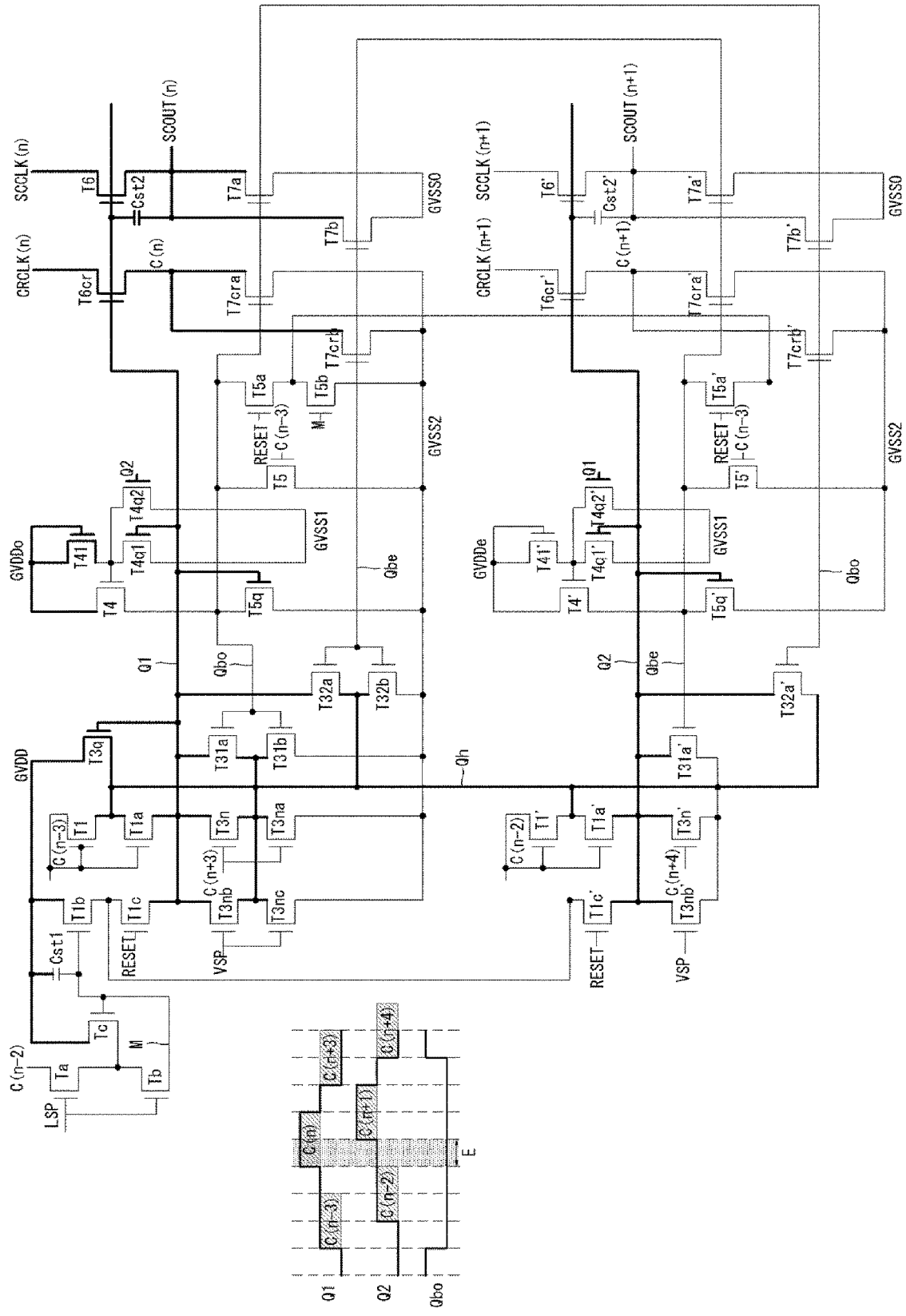

Referring to FIG. 7E, during a period E, the voltage of the carry signal C(n−2) is reduced from the GVDDo to the GVSS2.

During the period E, the transistors T1' and T1a' are turned off due to change in the voltage of the carry signal C(n−2). However, because the transistors T4$q$1, T4$q$2, T4$q$1' and T4$q$2' maintain a turn-on state, the voltages of the nodes Q1 and Q2 are held at the voltage level L2(GVDDo). Further, the voltages of the nodes Qbo and Qbe are held at the voltage level L1(GVSS0).

During the period E, the voltage of the scan shift clock SCCLK(n) increases to the power voltage GVDDo, and the voltage of the carry shift clock CRCLK(n) increases to the power voltage GVDDo. When the scan shift clock SCCLK(n) having the voltage GVDDo and the carry shift clock CRCLK(n) having the voltage GVDDo are input, the voltage of the node Q1 is boosted to the voltage level L3 capable of sufficiently turning on the pull-up transistors T6$cr$ and T6. When the pull-up transistors T6$cr$ and T6, of which the gate electrodes are connected to the node Q1, are turned on, the voltage of the image display gate pulse SCOUT(n) is the power voltage GVDDo, and the voltage of the carry signal C(n) is the power voltage GVDDo. On the other hand, the pull-up transistors T6$cr$' and T6', of which the gate electrodes are connected to the node Q2, maintain a turn-off state, the voltage of the image display gate pulse SCOUT(n+1) is the low potential power voltage GVSS0, and the voltage of the carry signal C(n+1) is the low potential power voltage GVSS2.

Figure 7F:
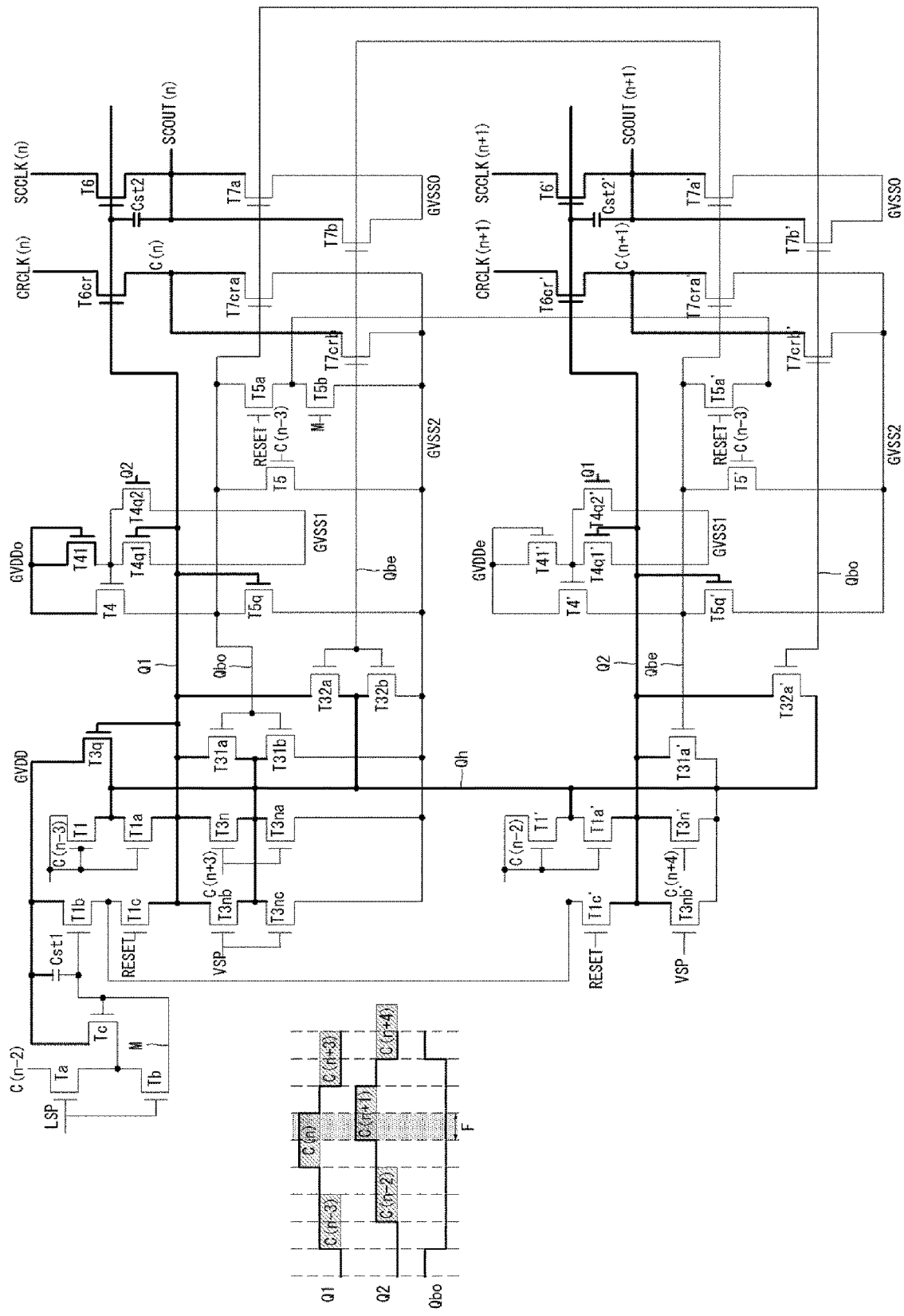

Referring to FIG. 7F, during a period F, the voltages of the scan shift clocks SCCLK(n) and SCCLK(n+1) are the power voltage GVDDo, and the voltages of the carry shift clocks CRCLK(n) and CRCLK(n+1) are the power voltage GVDDo. When the scan shift clocks SCCLK(n) and SCCLK(n+1) each having the voltage GVDDo and the carry shift clocks CRCLK(n) and CRCLK(n+1) each having the power voltage GVDDo are input, the voltage of the node Q1 is boosted to the voltage level L3 capable of sufficiently turning on the pull-up transistors T6$cr$ and T6. Further, the voltage of the node Q2 is boosted to the voltage level L3 capable of sufficiently turning on the pull-up transistors T6$cr$' and T6'.

During the period F, when the pull-up transistors T6$cr$ and T6, of which the gate electrodes are connected to the node Q1, are turned on, the voltage of the image display gate pulse SCOUT(n) is the power voltage GVDDo, and the voltage of the carry signal C(n) is the power voltage GVDDo. Further, when the pull-up transistors T6$cr$' and T6', of which the gate electrodes are connected to the node Q2, are turned on, the voltage of the image display gate pulse SCOUT(n+1) is the power voltage GVDDo, and the voltage of the carry signal C(n+1) is the power voltage GVDDo.

Figure 7G:
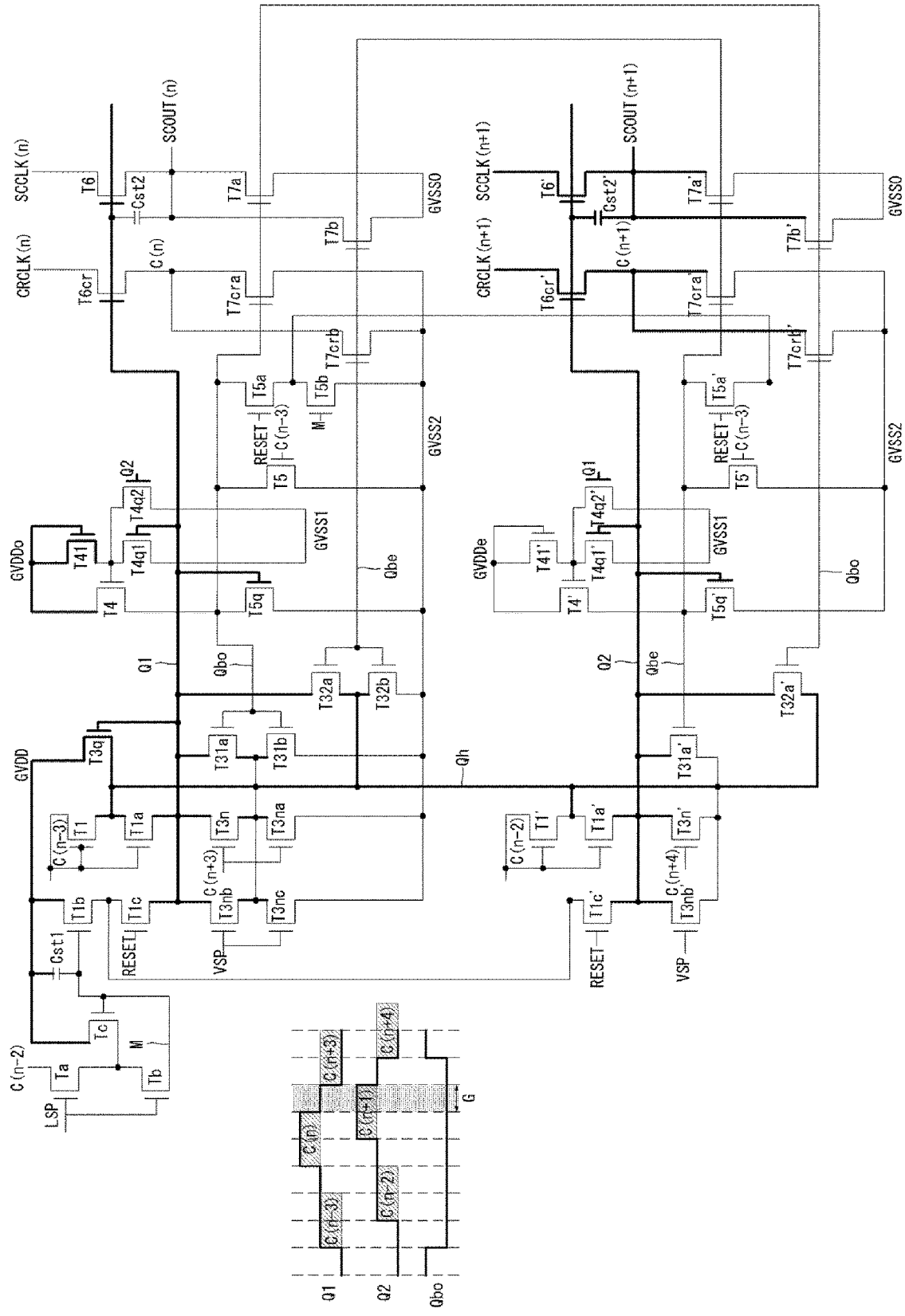

Referring to FIG. 7G, during a period G, the voltage of the scan shift clock SCCLK(n) is reduced to the low potential power voltage GVSS0, and the voltage of the carry shift clock CRCLK(n) is reduced to the low potential power voltage GVSS0. When the scan shift clock SCCLK(n) having the voltage GVSS0 and the carry shift clock CRCLK(n) having the voltage GVSS0 are input, the voltage of the node Q1 is reduced to the voltage level L2. In this instance, the pull-up transistors T6$cr$ and T6, of which the gate electrodes are connected to the node Q1, are turned off, the voltage of the image display gate pulse SCOUT(n) is the low potential power voltage GVSS0, and the voltage of the carry signal C(n) is the low potential power voltage GVSS0. On the other hand, the pull-up transistors T6$cr$' and T6', of which the gate electrodes are connected to the node Q2, maintain a turn-on state, the voltage of the image display gate pulse SCOUT(n+1) is the power voltage GVDDo, and the voltage of the carry signal C(n+1) is the power voltage GVDDo.

Figure 7H:
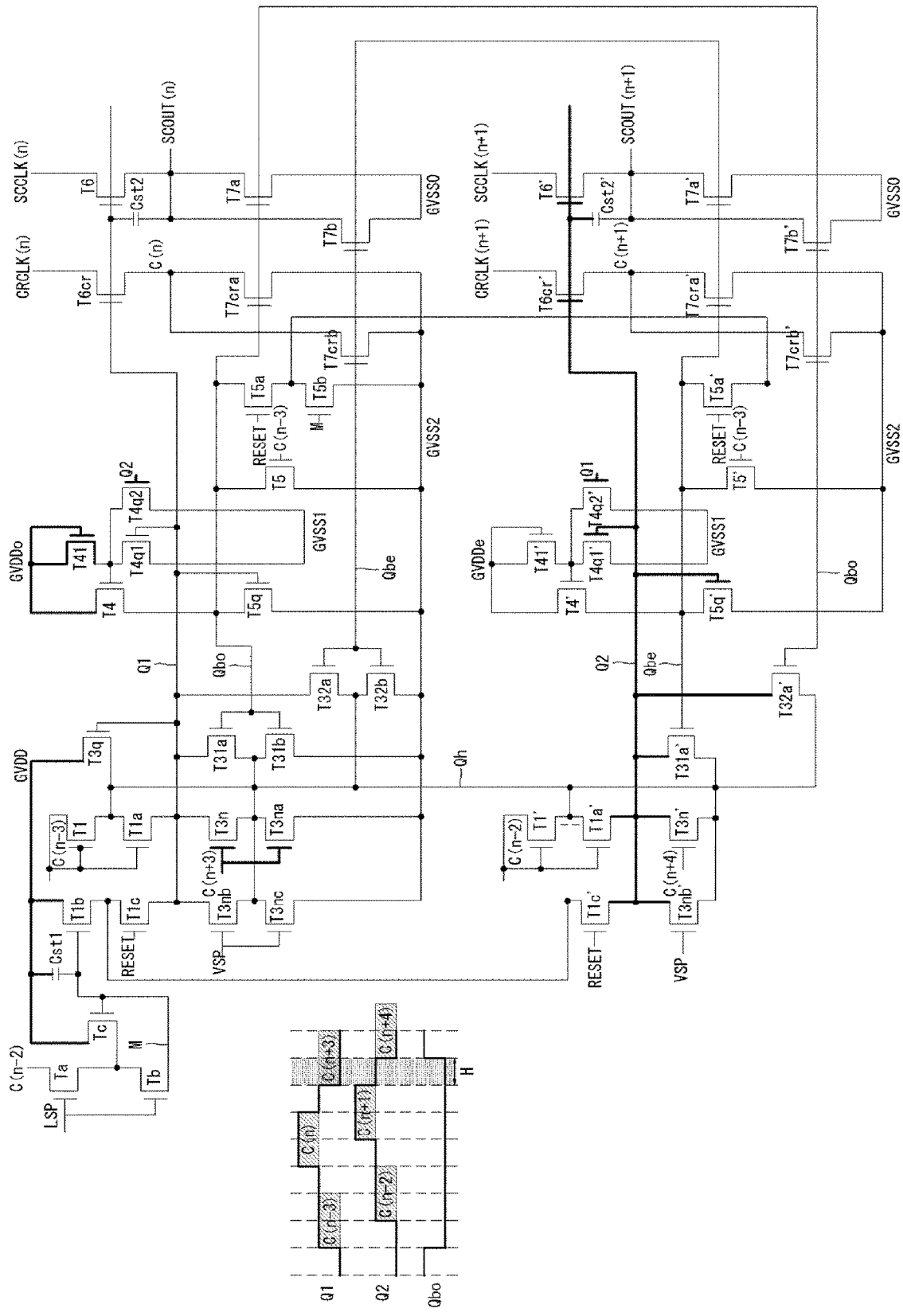

Referring to FIG. 7H, during a period H, when the carry signal C(n+3) having the voltage GVDDo is input, the transistors T3$n$ and T3$na$ are turned on. Hence, the voltages of the nodes Q1 and Qh are reduced to the low potential power voltage GVSS2.

During the period H, the voltage of the scan shift clock SCCLK(n+1) is reduced to the low potential power voltage GVSS0, and the voltage of the carry shift clock CRCLK(n+1) is reduced to the low potential power voltage GVSS0. When the scan shift clock SCCLK(n+1) having the voltage GVSS0 and the carry shift clock CRCLK(n+1) having the voltage GVSS0 are input, the voltage of the node Q2 is reduced to the voltage level L2(GVSS2). In this instance, the pull-up transistors T6$cr$' and T6', of which the gate electrodes are connected to the node Q2, are turned off, the voltage of the image display gate pulse SCOUT(n+1) is the low potential power voltage GVSS0, and the voltage of the carry signal C(n+1) is the low potential power voltage GVSS2.

Figure 7I:
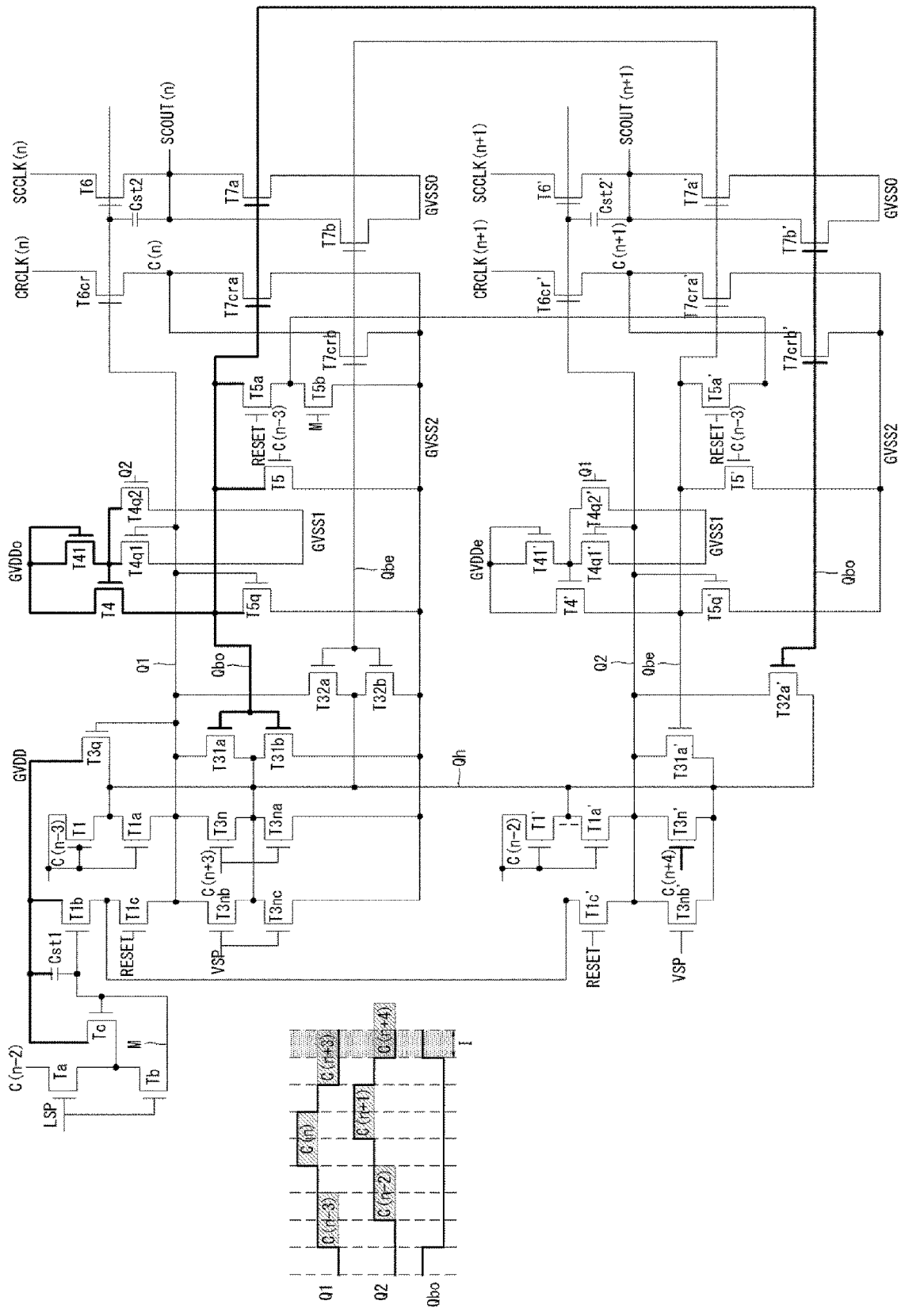

Referring to FIG. 7I, during a period I, when the carry signal C(n+4) having the voltage GVDDo is input, the transistor T3$n$' is turned on. Further, the node Q2 and the node Qh are connected, and the voltage of the node Qh is reduced to the low potential power voltage GVSS2.

During the period I, the transistors T4$q$1 and T4$q$2 are turned off, and the transistor T4 is turned off. Hence, the voltage of the node Qbo increases to the power voltage GVDDo. In this instance, the transistors T31$a$, T31$b$ and T32$a$', of which the gate electrodes are connected to the node Qbo, are turned on. Hence, the voltage of the node Q1 is held at the voltage level L2(GVSS2), and the voltage of the node Q2 is reduced to the voltage level L2(GVSS2).

Figure 8:
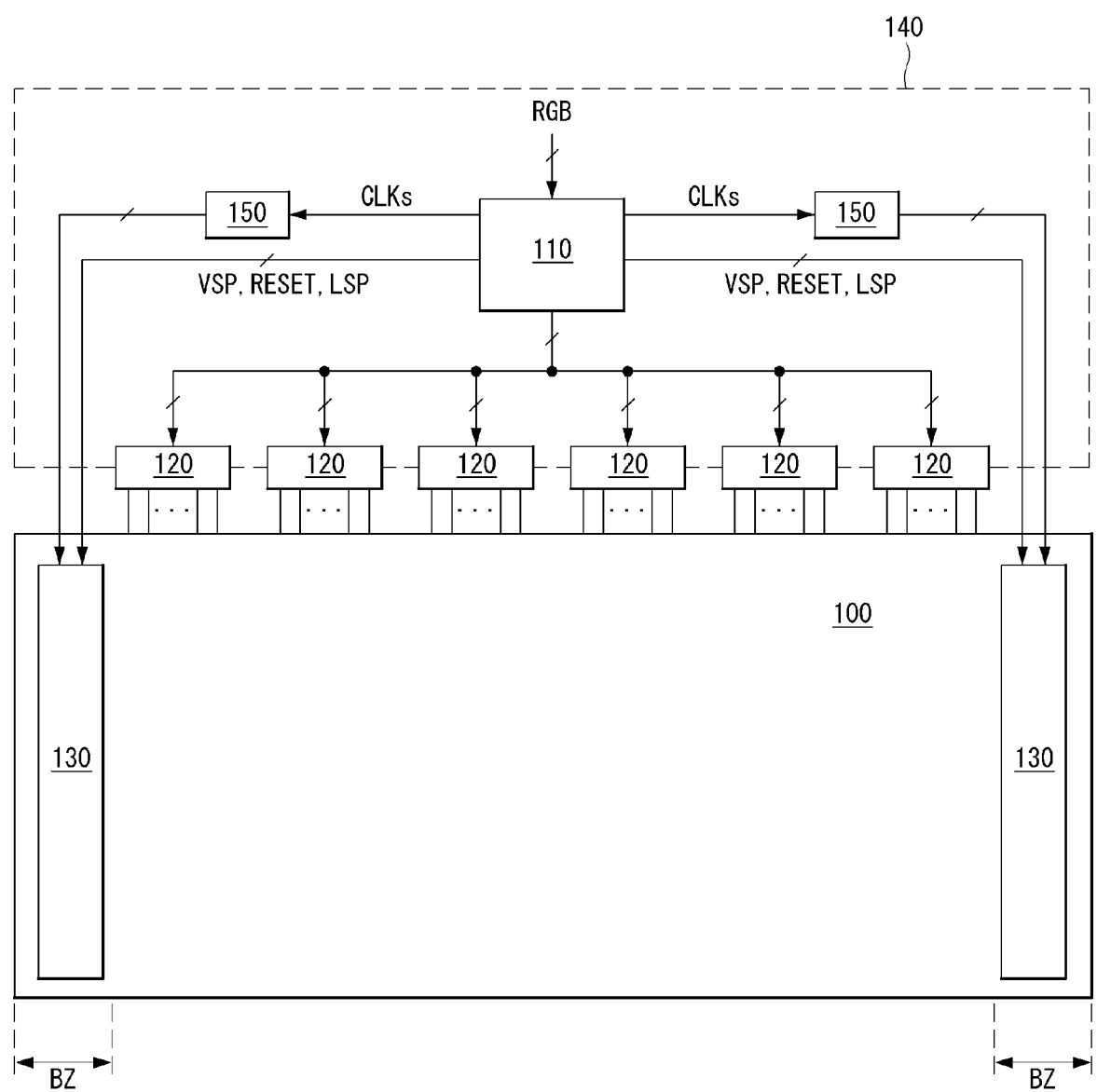
FIG. 8 illustrates an organic light emitting diode display including a gate shift register according to an aspect of the disclosure.

FIG. 8 illustrates an organic light emitting diode display including a gate shift register according to an aspect of the disclosure.

Referring to FIG. 8, an organic light emitting diode (OLED) display according to an aspect of the disclosure includes a display panel 100, and a data driving circuit including a plurality of source driver ICs 120, a scan driving circuit, a timing controller 110 on a printed circuit board (PCB), and the like.

A plurality of data lines, a plurality of sensing lines, and a plurality of gate lines are disposed to intersect one another on the display panel 100, and pixels for external compensation are respectively arranged at intersections of the lines in a matrix to constitute a pixel array for external compensation. Each pixel may include an OLED, a driving thin film transistor (TFT), a storage capacitor, a first transistor, and a second transistor. The transistors constituting the pixel may be implemented as p-type transistors, n-type transistors, or hybrid-type transistors in which p-type transistors and n-type transistors are mixed. Further, a semiconductor layer of the transistor may include amorphous silicon, polycrystalline silicon, or oxide.

The OLED display according to the aspect of the disclosure including the pixel array for external compensation can sense electrical characteristics of the OLED and the driving TFT and can correct image display data depending on a sensing result. The electrical characteristics of the OLED may include an operation point voltage of the OLED. The electrical characteristics of the driving TFT may include a threshold voltage and electron mobility of the driving TFT.

The OLED display according to the aspect of the disclosure including the pixel array for external compensation is disclosed in Korean Patent Publication Nos. 10-2015-0052606(2015.05.14), 10-2016-0007971(2016.01.21), 10-2016-0001822(2016.01.07) etc. corresponding to the present applicant, and which are hereby incorporated by reference in their entirety.

The OLED display according to the aspect of the disclosure performs a real-time sensing process for sensing electrical characteristics of the pixels. The OLED display according to the aspect of the disclosure performs a sensing operation in a vertical blanking interval BP excluding an image data writing period WP from one frame. In this instance, one pixel line is sensed in each frame. In aspects disclosed herein, the pixel line indicates a set of horizontally adjacent pixels, and as many pixels as a horizontal resolution are arranged on one pixel line. A panel driving circuit sequentially supplies image display gate pulses to the gate lines of the display panel 100 during the image data writing period WP and writes image display data to all the pixels of the display panel 100. In the vertical blanking interval BP, the panel driving circuit supplies a sensing gate pulse to only gate lines connected to a specific pixel line and writes sensing data to pixels of the specific pixel line.

To this end, the data driving circuit includes a plurality of source driver integrated circuits (ICs) 120. The source driver ICs 120 receive image display data RGB from the timing controller 110. The source driver ICs 120 convert the image display data RGB into gamma compensation voltages in response to a source timing control signal received from the timing controller 110 and generates data voltages. The source driver ICs 120 supply the data voltages to the data lines of the display panel 100 so that the data voltages are synchronized with the image display gate pulses. The source driver ICs 120 may be connected to the data lines of the display panel 100 through a chip-on glass (COG) process or a tape automated bonding (TAB) process.

The scan driving circuit includes a level shifter 150 and a gate shift register 130 that are connected between the timing controller 110 and the gate lines of the display panel 100.

The level shifter 150 level-shifts a transistor-transistor logic (TTL) level voltage of clock signals CLKs received from the timing controller 110 to a gate high voltage and a gate low voltage capable of switching the transistors of the display panel 100. The gate shift register 130, as described above with reference to FIGS. 1 to 7I, can output the sensing gate pulses in random order in the vertical blanking interval BP through stages having simpler configuration than a relate art, thereby irregularly selecting a sensing target pixel line.

The scan driving circuit may be directly formed on a lower substrate of the display panel 100 using a gate driver-in panel (GIP) manner. In the GIP manner, the level shifter 150 may be mounted on a printed circuit board (PCB) 140, and the gate shift register 130 may be formed on the lower substrate of the display panel 100. The gate shift register 130 is formed in a bezel area BZ of the display panel 100 in which an image is not displayed.

The timing controller 110 receives the image display data RGB from an external host system through known various interface manners. The timing controller 110 can correct the image display data RGB based on a sensing result of the real-time sensing process so that a variation in electrical characteristics between the pixels is compensated, and then can transmit the corrected image display data RGB to the source driver ICs 120.

The timing controller 110 receives timing signals such as a vertical sync signal Vsync, a horizontal sync signal Hsync, a data enable signal DE, and a main clock MCLK from the host system. The timing controller 110 generates a data timing control signal for controlling operation timing of the data driving circuit and a scan timing control signal for controlling operation timing of the scan driving circuit based on the timing signals from the host system.

The scan timing control signal includes a line sampling signal LSP, a global reset signal RESET, a global start signal VSP, a clock signal CLKs, and the like.

The data timing control signal includes a source sampling clock SSC, a source output enable signal SOE, and the like. The source sampling clock SSC is a clock signal controlling a sampling timing of data inside the source driver ICs 120 based on a rising edge or a falling edge. The source output enable signal SOE is a signal controlling an output timing of the data voltage.

The aspects of the disclosure have the following effects.

First, the aspects of the disclosure can considerably simplify configuration of the gate shift register for implementing the real-time sensing process, compared to the related art. The aspects of the disclosure can irregularly select the sensing target pixel line in spite of the simple configuration of the gate shift register by outputting the sensing gate pulses in random order in the vertical blanking interval. The aspects of the disclosure can prevent the problem of the related art that a luminance variation resulting from the sequential sensing is perceived, by irregularly selecting the sensing target pixel line.

Second, the aspects of the disclosure can have a low probability of occurrence of a process failure and high reliability of operation because it includes the gate shift register having the simpler configuration than the related art.

Third, when the gate shift register according to the aspects of the disclosure is embedded in the display panel, the aspects of the disclosure can reduce the bezel size due to the simple configuration of the gate shift register. Further, because the gate shift register according to the aspects of the disclosure does not require the clock line and the power line for the real-time sensing, the aspects of the disclosure are more advantageous in the power consumption than the related art.

Although the aspects have been described with reference to a number of illustrative aspects thereof, numerous other modifications and aspects may be devised by those skilled in the art that will fall within the scope of the principles of this disclosure. In particular, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A gate shift register comprising:
   a first stage including a node Q1, a node Qbo, a node M, a first sensing control block configured to activate the node Q1, and a second sensing control block configured to deactivate the node Qbo; and
   a second stage including a node Q2, a node Qbe, a third sensing control block configured to activate the node Q2, and a fourth sensing control block configured to deactivate the node Qbe,
   wherein the first and second stages configured to output an image display gate pulse during an image data writing period and selectively output a sensing gate pulse in a vertical blanking interval in which the image display data is not written, and the first and second stages share a portion of circuits of the first and second stages necessary for driving with each other.

2. The gate shift register of claim 1, wherein the node Q1 is activated in accordance with a voltage of the node M and a global reset signal, and the node Qbo is deactivated in accordance with the voltage of the node M and the global reset signal, the node Q2 is activated in accordance with the voltage of the node M and the global reset signal, and the node Qbe is deactivated in accordance with the voltage of the node M and the global reset signal.

3. The gate shift register of claim 2, wherein the portion of circuit of the first stage and the second stage shared by the first and second stages include the node Qbo and the node Qbe,
wherein the third sensing control block is connected to the first sensing control block, and the fourth sensing control block is connected to the second sensing control block.

4. The gate shift register of claim 2, further comprising a global start signal being input subsequent to the global reset signal in the vertical blanking interval,
wherein the voltage of the node M is activated by a carry signal synchronized with a line sampling signal during the image data writing period and maintains an activated state until the global start signal is input.

5. The gate shift register of claim 2, wherein the first stage and the second stage further comprise a first input block and a second input block that share a node Qh with each other,
wherein the first input block activates the node Qh to a high potential power voltage in accordance with a voltage of the node Q1,
wherein the second input block connects the node Q2 to the node Qh in accordance with a voltage of the node Qbe or connects the node Q2 to the node Qh in accordance with a voltage of the node Qbo.

6. The gate shift register of claim 4, wherein the first sensing control block further comprises:
a transistor Ta turned on in response to the line sampling signal and configured to apply the carry signal to a node N1;
a transistor Tb turned on in response to the line sampling signal and connect the node N1 to the node M;
a transistor Tc turned on in response to the voltage of the node M and configured to apply a high potential power voltage to the node M;
a transistor T1$b$ turned on in response to the voltage of the node M and configured to apply the high potential power voltage to a node N3;
a transistor T1$c$ turned on in response to the global reset signal and configured to connect the node N3 to the node Q1; and
a capacitor connected between an input terminal of the high potential power voltage and the node M.

7. The gate shift register of claim 6, wherein the third sensing control block comprises a transistor T1$c$' that is turned on in response to the global reset signal and connects the node N3 to the node Q2.

8. The gate shift register of claim 4, wherein the second sensing control block comprises:
a transistor T5$a$ turned on in response to the global reset signal and configured to connect the node Qbo to a node N4; and
a transistor T5$b$ turned on in response to the voltage of the node M and configured to apply a low potential power voltage to the node N4.

9. The gate shift register of claim 8, wherein the fourth sensing control block comprises a transistor T5$a$' that is turned on in response to the global reset signal and connects the node Qbe to the node N4.

10. The gate shift register of claim 5, wherein the first input block comprises a transistor T3$q$ that is turned on in response to the voltage of the node Q1 and applies the high potential power voltage to the node Qh,
wherein the second input block includes:
a transistor T31$a$' turned on in response to the voltage of the node Qbe and configured to connect the node Q2 to the node Qh; and
a transistor T32$a$' turned on in response to the voltage of the node Qbo and configured to connect the node Q2 to the node Qh.

11. The gate shift register of claim 2, wherein the first stage further comprises a first output block, the first output block including:
a first pull-up transistor turned on in response to a voltage of the node Q1 and configured to output a first carry shift clock to a node N6;
a second pull-up transistor turned on in response to the voltage of the node Q1 and configured to output a first scan shift clock to a node N7;
a first pull-down transistor turned on in response to a voltage of the node Qbo and output a first low potential power voltage to the node N6; and
a second pull-down transistor turned on in response to the voltage of the node Qbo and configured to output a second low potential power voltage to the node N7,
wherein the second stage further comprises a second output block, the second output block including:
a third pull-up transistor turned on in response to a voltage of the node Q2 and configured to output a second carry shift clock to a node N6';
a fourth pull-up transistor turned on in response to the voltage of the node Q2 and configured to output a second scan shift clock to a node N7';
a third pull-down transistor turned on in response to the voltage of the node Qbo and configured to output the first low potential power voltage to the node N6'; and
a fourth pull-down transistor turned on in response to the voltage of the node Qbo and configured to output the second low potential power voltage to the node N7',
wherein swing widths of the first and second carry shift clocks are greater than swing widths of the first and second scan shift clocks,
wherein the first low potential power voltage is less than the second low potential power voltage.

12. An organic light emitting diode display comprising:
a display panel including a plurality of gate lines; and
a scan driving circuit configured to drive the plurality of gate lines in accordance with an output of a gate shift register,
wherein the gate shift register comprises,
a first stage including a node Q1, a node Qbo, a node M, a first sensing control block configured to activate the node Q1, and a second sensing control block configured to deactivate the node Qbo,
a second stage including a node Q2, a node Qbe, a third sensing control block configured to activate the node Q2, and a fourth sensing control block configured to deactivate the node Qbe,
wherein the first and second stages outputting an image display gate pulse during an image data writing period and selectively outputting a sensing gate pulse in a vertical blanking interval in which the image display data is not written, wherein the first and second stages share a portion of circuits of the first and second stages necessary for driving with each other.

13. The gate shift register of claim 12, wherein the node Q1 is activated in accordance with a voltage of the node M and a global reset signal, and the node Qbo is deactivated in accordance with the voltage of the node M and the global reset signal, the node Q2 is activated in accordance with the voltage of the node M and the global reset signal, and the node Qbe is deactivated in accordance with the voltage of the node M and the global reset signal.

14. The gate shift register of claim 13, wherein the portion of circuit of the first stage and the second stage shared by the first and second stages include the node Qbo and the node Qbe,
wherein the third sensing control block is connected to the first sensing control block, and the fourth sensing control block is connected to the second sensing control block.

15. The gate shift register of claim 13, further comprising a global start signal being input subsequent to the global reset signal in the vertical blanking interval,
wherein the voltage of the node M is activated by a carry signal synchronized with a line sampling signal during the image data writing period and maintains an activated state until the global start signal is input.

16. The gate shift register of claim 13, wherein the first stage and the second stage further comprise a first input block and a second input block that share a node Qh with each other,
wherein the first input block activates the node Qh to a high potential power voltage in accordance with a voltage of the node Q1,
wherein the second input block connects the node Q2 to the node Qh in accordance with a voltage of the node Qbe or connects the node Q2 to the node Qh in accordance with a voltage of the node Qbo.

17. The gate shift register of claim 15, wherein the first sensing control block further comprises:
a transistor Ta turned on in response to the line sampling signal and configured to apply the carry signal to a node N1;
a transistor Tb turned on in response to the line sampling signal and connect the node N1 to the node M;
a transistor Tc turned on in response to the voltage of the node M and configured to apply a high potential power voltage to the node M;
a transistor T1b turned on in response to the voltage of the node M and configured to apply the high potential power voltage to a node N3;
a transistor T1c turned on in response to the global reset signal and configured to connect the node N3 to the node Q1; and
a capacitor connected between an input terminal of the high potential power voltage and the node M.

18. The gate shift register of claim 17, wherein the third sensing control block comprises a transistor T1c' that is turned on in response to the global reset signal and connects the node N3 to the node Q2.

19. The gate shift register of claim 15, wherein the second sensing control block comprises:
a transistor T5a turned on in response to the global reset signal and configured to connect the node Qbo to a node N4; and
a transistor T5b turned on in response to the voltage of the node M and configured to apply a low potential power voltage to the node N4.

20. The gate shift register of claim 19, wherein the fourth sensing control block comprises a transistor T5a' that is turned on in response to the global reset signal and connects the node Qbe to the node N4.

21. The gate shift register of claim 16, wherein the first input block comprises a transistor T3q that is turned on in response to the voltage of the node Q1 and applies the high potential power voltage to the node Qh,
wherein the second input block includes:
a transistor T31a' turned on in response to the voltage of the node Qbe and configured to connect the node Q2 to the node Qh; and
a transistor T32a' turned on in response to the voltage of the node Qbo and configured to connect the node Q2 to the node Qh.

22. The gate shift register of claim 13, wherein the first stage further comprises a first output block, the first output block including:
a first pull-up transistor turned on in response to a voltage of the node Q1 and configured to output a first carry shift clock to a node N6;
a second pull-up transistor turned on in response to the voltage of the node Q1 and configured to output a first scan shift clock to a node N7;
a first pull-down transistor turned on in response to a voltage of the node Qbo and output a first low potential power voltage to the node N6; and
a second pull-down transistor turned on in response to the voltage of the node Qbo and configured to output a second low potential power voltage to the node N7,
wherein the second stage further comprises a second output block, the second output block including:
a third pull-up transistor turned on in response to a voltage of the node Q2 and configured to output a second carry shift clock to a node N6';
a fourth pull-up transistor turned on in response to the voltage of the node Q2 and configured to output a second scan shift clock to a node N7';
a third pull-down transistor turned on in response to the voltage of the node Qbo and configured to output the first low potential power voltage to the node N6'; and
a fourth pull-down transistor turned on in response to the voltage of the node Qbo and configured to output the second low potential power voltage to the node N7',
wherein swing widths of the first and second carry shift clocks are greater than swing widths of the first and second scan shift clocks,
wherein the first low potential power voltage is less than the second low potential power voltage.

* * * * *